(12) United States Patent
Kwon et al.

(10) Patent No.: US 11,569,343 B2
(45) Date of Patent: Jan. 31, 2023

(54) METAL-INSULATOR-METAL CAPACITORS

(71) Applicant: SK Hynix system ic Inc., Chungcheongbuk-do (KR)

(72) Inventors: Kyung Wook Kwon, Chungcheongbuk-do (KR); Mun Young Lee, Chungcheongbuk-do (KR); Myoung Kyun Choi, Chungcheongbuk-do (KR)

(73) Assignee: SK HYNIX SYSTEM IC INC., Chungcheongbuk-do (KR)

( * ) Notice: Subject to any disclaimer, the term of this patent is extended or adjusted under 35 U.S.C. 154(b) by 0 days.

(21) Appl. No.: 17/142,489

(22) Filed: Jan. 6, 2021

(65) Prior Publication Data

US 2021/0384293 A1     Dec. 9, 2021

(30) Foreign Application Priority Data

Jun. 9, 2020   (KR) .......................... 10-2020-0069918

(51) Int. Cl.
*H01L 23/522*   (2006.01)
*H01L 27/08*    (2006.01)
*H01L 49/02*    (2006.01)

(52) U.S. Cl.
CPC .......... *H01L 28/65* (2013.01); *H01L 23/5223* (2013.01); *H01L 28/56* (2013.01)

(58) Field of Classification Search
CPC ......... H01L 28/65; H01L 28/56; H01L 28/60; H01L 23/5223; H01L 28/40
See application file for complete search history.

(56) References Cited

U.S. PATENT DOCUMENTS

| | | | |
|---|---|---|---|
| 2016/0336311 A1* | 11/2016 | Kim | H01L 28/91 |
| 2017/0288012 A1* | 10/2017 | Cheon | H01L 28/40 |
| 2018/0076134 A1* | 3/2018 | Jing | H01L 23/5225 |
| 2018/0254218 A1* | 9/2018 | Cheng | H01L 28/88 |
| 2019/0312028 A1* | 10/2019 | Park | H01L 28/40 |

* cited by examiner

*Primary Examiner* — Omar F Mojaddedi
(74) *Attorney, Agent, or Firm* — IP & T Group LLP

(57) ABSTRACT

A metal-insulator-metal (MIM) capacitor includes a first group of metal contacts disposed on a first region of an isolation layer spaced apart from each other in a first direction, a second group of metal contacts disposed on a second region of the isolation layer spaced apart from each other in the first direction, a dielectric layer disposed between the first group of metal contacts and the second group of metal contacts, a first metal electrode disposed to contact the top surfaces of the first group of metal contacts, and a second metal electrode disposed to contact the top surfaces of the second group of metal contacts.

4 Claims, 25 Drawing Sheets

METAL-INSULATOR-METAL CAPACITORS

CROSS-REFERENCE TO RELATED APPLICATIONS

The present application claims priority under 35 U.S.C 119(a) to Korean Application No. 10-2020-0069918, filed on Jun. 9, 2020, which is herein incorporated by reference in its entirety.

BACKGROUND

1. Technical Field

Various embodiments of the present disclosure relate generally to metal-insulator-metal (MIM) capacitors and, more particularly, to MIM capacitors using a contact in field area (CIFA).

2. Related Art

Capacitors are 2-port passive elements suitable for storing electric energy in an electric field. Generally, capacitors provide capacitance to a circuit and are employed in electronic circuits for blocking a direct current while allowing the flow of an alternating current.

MIM capacitors are one type of capacitors which may be used in diverse application areas. For example, MIM capacitors may be used in radio frequency (RF) circuits, in analog integrated circuits, and as decoupling elements in high power microprocessor units (MPUs). Furthermore, MIM capacitors may be useful in data storing in dynamic random-access random memory (DRAM) cells. Because of their diverse applications, there is a need to provide even higher performance MIM capacitors exhibiting enhanced thermal stability and a more accurate capacitance value than existing MIM capacitors.

SUMMARY

According to a first embodiment of the present disclosure, a metal-insulator-metal (MIM) capacitor includes a first group of metal contacts disposed on a first region of an isolation layer spaced apart from each other in a first direction, a second group of metal contacts disposed on a second region of the isolation layer spaced apart from each other in the first direction, a dielectric layer disposed between the first group of metal contacts and the second group of metal contacts, a first metal electrode disposed to contact the top surfaces of the first group of metal contacts, and a second metal electrode disposed to contact the top surfaces of the second group of metal contacts.

According to a second embodiment of the present disclosure, a metal-insulator-metal (MIM) capacitor includes a first group of metal contacts disposed on a first region of an isolation layer on a semiconductor layer spaced apart from each other in a first direction, a second group of metal contacts disposed on a second region of the isolation layer spaced apart from each other in the first direction, a third group of metal contacts disposed on a third region between the first and second region of the isolation layer spaced apart from each other in the first direction, a dielectric layer disposed between the first to third groups of metal contacts, a first metal electrode disposed to contact the top surfaces of the first and second groups of metal contacts and a top surface of an endmost one of the third group of metal contacts, and a second metal electrode disposed to contact the top surfaces of the remaining metal contacts except the endmost one of the third group of metal contacts among the third group of metal contacts.

According to a third embodiment of the present disclosure, a metal-insulator-metal (MIM) capacitor includes metal contacts disposed on an isolation layer on a semiconductor layer spaced apart from each other in a first direction, a dielectric layer disposed between the metal contacts, a first metal electrode disposed to contact the top surfaces of odd-numbered metal contacts of the metal contacts, and a second metal electrode disposed to contact the top surfaces of even-numbered metal contacts of the metal contacts.

According to a fourth embodiment of the present disclosure, a metal-insulator-metal (MIM) capacitor includes a first group of metal contacts disposed on a first region of an isolation layer on a semiconductor layer spaced apart from each other in a first direction, a second group of metal contacts disposed on a second region of the isolation layer spaced apart from each other in the first direction, a dielectric layer disposed between the first group of metal contacts and between the second group of metal contacts, a first metal electrode disposed to contact the top surfaces of odd-numbered metal contacts of the first group of metal contacts and the top surfaces of odd-numbered metal contacts of the second group of metal contacts, and a second metal electrode disposed to contact the top surfaces of even-numbered metal contacts of the first group of metal contacts and the top surfaces of even-numbered metal contacts of the second group of metal contacts.

According to a fifth embodiment of the present disclosure, a metal-insulator-metal (MIM) capacitor includes a first sidewall spacer disposed on side surfaces of a first conductive pattern which is disposed on an isolation layer on a semiconductor layer to extend in a first direction and have an elongated line shape, a second sidewall spacer disposed on side surfaces of a second conductive pattern which is disposed on the isolation layer to extend in a first direction and have an elongated line shape and which is spaced apart from the first conductive pattern in a second direction intersecting the first direction, a dielectric layer disposed on the first sidewall spacer and the second sidewall spacer, a plurality of metal contacts spaced apart from each other in the first direction and that penetrate the dielectric layer and the first and second sidewall spacers, a first metal electrode disposed to contact the top surfaces of odd-numbered metal contacts of the plurality of metal contacts, and a second metal electrode disposed to contact the top surfaces of even-numbered metal contacts of the plurality of metal contacts.

According to a sixth embodiment of the present disclosure, a metal-insulator-metal (MIM) capacitor includes a first sidewall spacer disposed on side surfaces of a first conductive pattern which is disposed on an isolation layer on a semiconductor layer to extend in a first direction and have an elongated line shape, a second sidewall spacer disposed on side surfaces of a second conductive pattern which is disposed on the isolation layer to extend in a first direction and have an elongated line shape, a third sidewall spacer disposed on side surfaces of a third conductive pattern which is disposed between the first and second conductive patterns on the isolation layer to extend in a first direction and have an elongated line shape and which is spaced apart from the first and second conductive patterns in a second direction intersecting the first direction, a dielectric layer disposed on the first to third sidewall spacers, a first group of metal contacts spaced apart from each other in the first direction and that penetrate the dielectric layer and the first and third sidewall spacers, a second group of metal contacts spaced apart from each other in the first direction and that penetrate the dielectric layer and the second and third sidewall spacers, a first metal electrode disposed to contact the top surfaces of odd-numbered metal contacts of the first group of metal contacts and the top surfaces of odd-numbered metal contacts of the second group of metal contacts, and a second metal electrode disposed to contact the top surfaces of even-numbered metal contacts of the first group of metal contacts and the top surfaces of even-numbered metal contacts of the second group of metal contacts.

These and other features and advantages of the present invention will become better understood by the following detailed description and drawings.

BRIEF DESCRIPTION OF THE DRAWINGS

In the accompanying figures like reference numerals refer to identical or functionally similar elements throughout the separate views. The figures together with the detailed description disclose various embodiments of the present invention, and the various principles and advantages thereof.

DETAILED DESCRIPTION OF THE EMBODIMENTS

In the following description of embodiments, it will be understood that the terms "first" and "second" are intended to identify elements, but not used to define a particular number or sequence of elements. In addition, when an element is referred to as being located "on," "over," "above," "under," or "beneath" another element, it is intended to mean relative position relationship, but not used to limit certain cases that the element directly contacts the other element, or at least one intervening element is present therebetween. Accordingly, the terms such as "on," "over," "above," "under," "beneath," "below," and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may be electrically or mechanically connected or coupled to the other element indirectly with one or more additional elements therebetween.

Various embodiments are directed to MIM capacitors using a contact in field area (CIFA).

Figure 1:
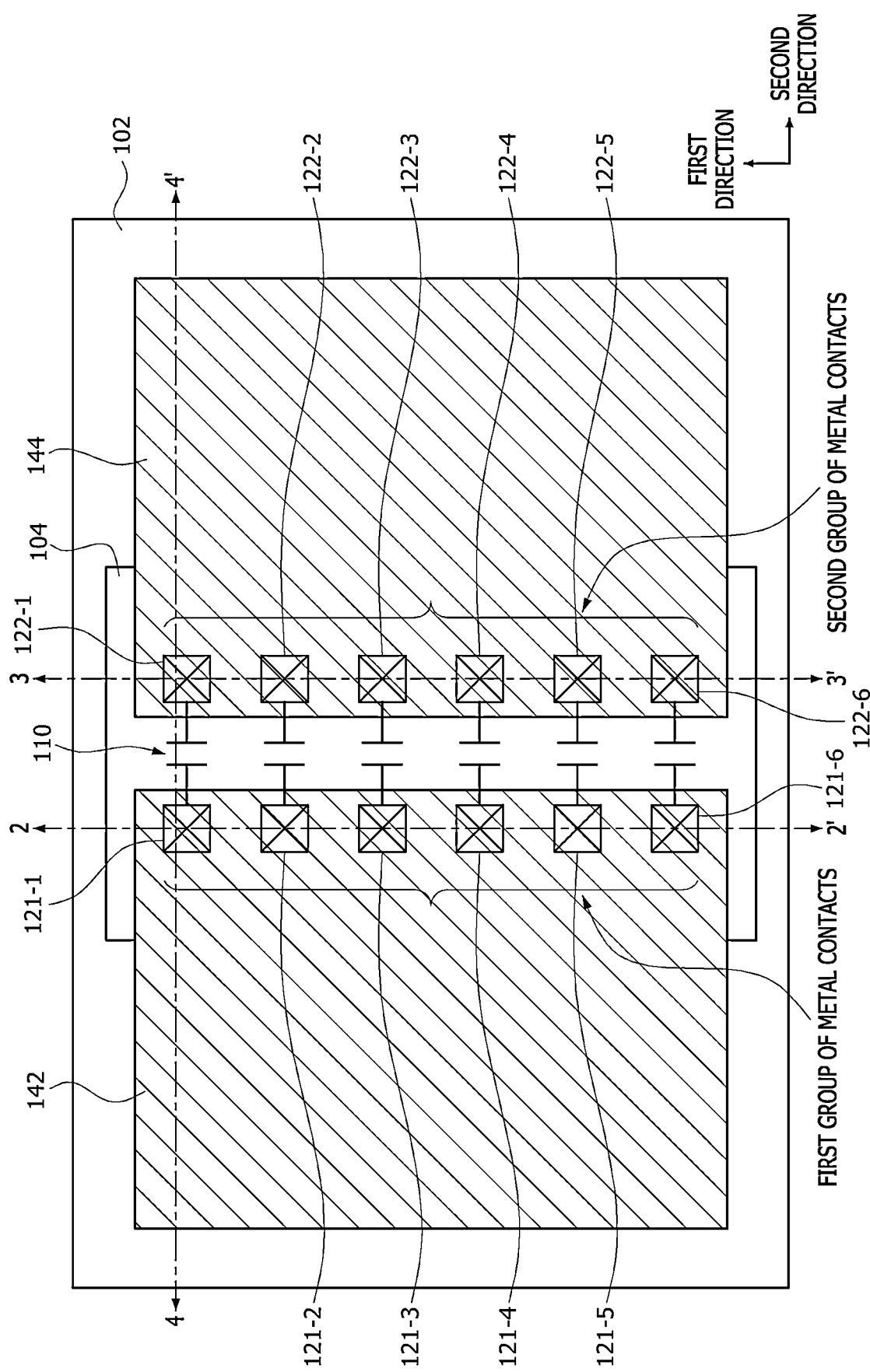
FIG. 1 is a layout diagram illustrating an MIM capacitor according to an embodiment of the present disclosure.
Figure 2:
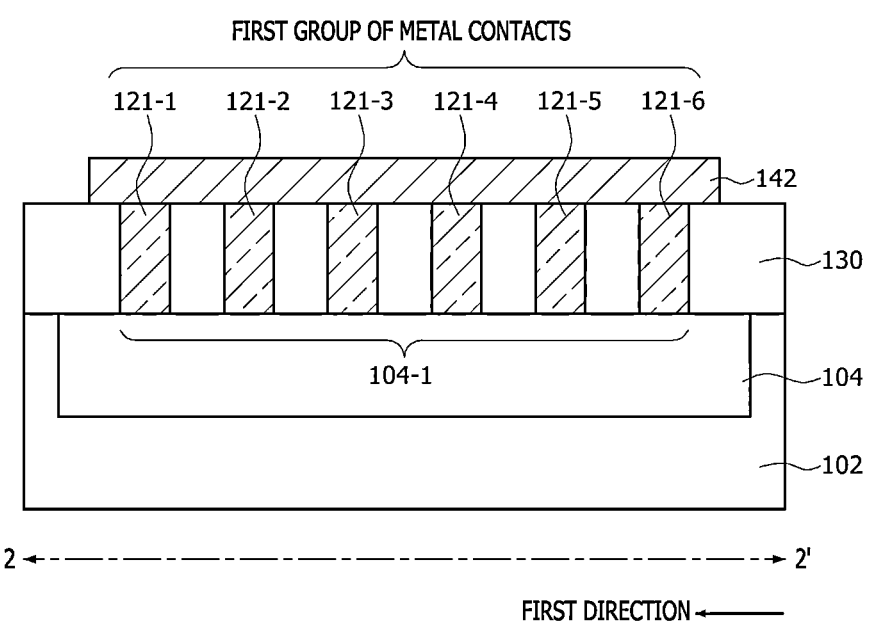
FIG. 2 is a cross-sectional view taken along a line 2-2' of FIG. 1.
Figure 3:
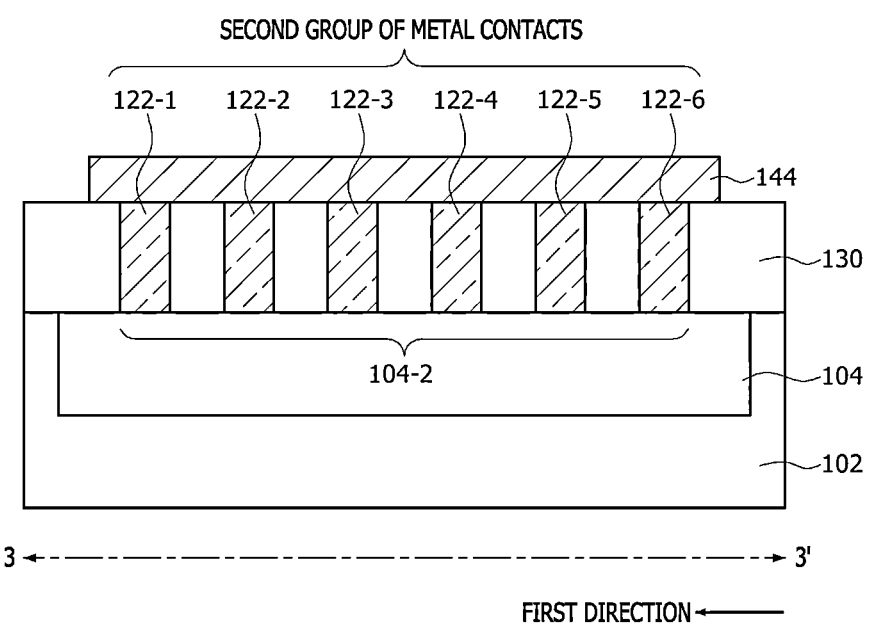
FIG. 3 is a cross-sectional view taken along a line 3-3' of FIG. 1.
Figure 4:
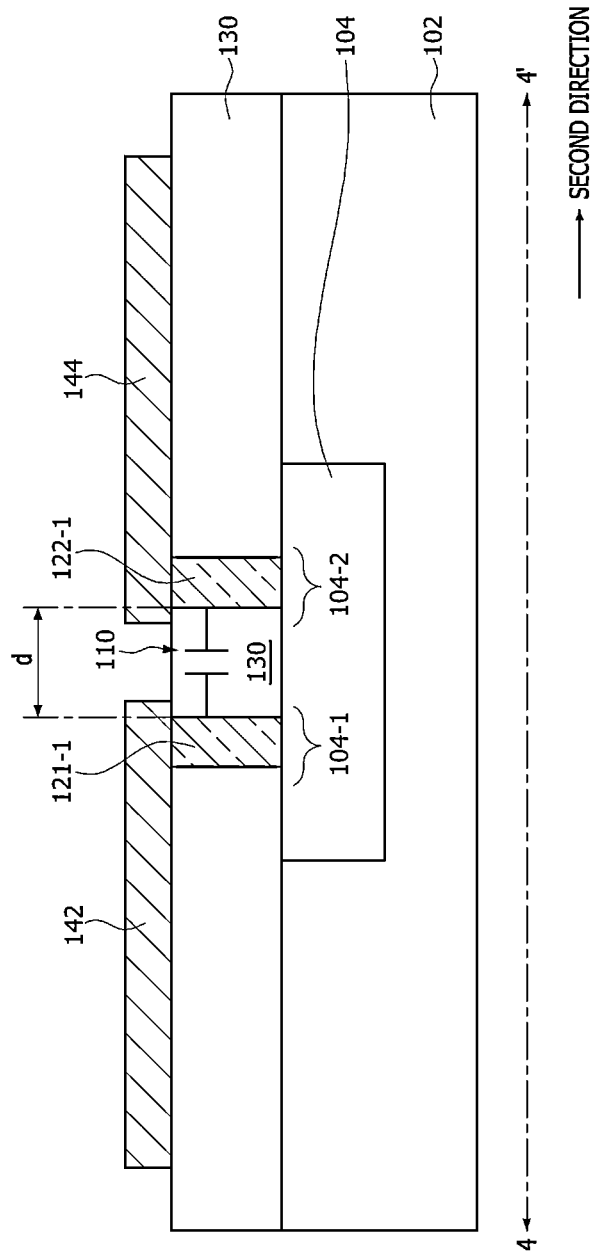
FIG. 4 is a cross-sectional view taken along a line 4-4' of FIG. 1.

FIG. 1 is a layout diagram illustrating an MIM capacitor 110 according to an embodiment of the present disclosure. FIGS. 2, 3, and 4 are cross-sectional views taken along lines 2-2', 3-3', and 4-4' of FIG. 1, respectively. Referring to FIGS. 1 to 4, the MIM capacitor 110 according to a first embodiment of the present disclosure may be disposed on an isolation layer 104. The isolation layer 104 may be disposed on or in a semiconductor layer 102. In an embodiment, the semiconductor layer 102 may be a semiconductor substrate comprised of a semiconductor material such as a silicon material. In another embodiment, the semiconductor layer 102 may be an impurity diffusion layer which is doped with impurities. The isolation layer 104 may be a shallow trench isolation layer disposed in an upper portion of the semiconductor layer 102. In another embodiment, the isolation layer 104 may protrude from a top surface of the semiconductor layer 102.

The MIM capacitor 110 may include a first group of metal contacts 121-1, . . . , and 121-6, a second group of metal contacts 122-1, . . . , and 122-6, a dielectric layer 130, a first metal electrode 142, and a second metal electrode 144. In an embodiment, the number of the first group of metal contacts 121-1, . . . , and 121-6 are equal to the number of the second group of metal contacts 122-1, . . . , and 122-6, however, the invention is not limited in this way. Although the present embodiment is described in conjunction with a case that the number of the first group of metal contacts 121-1, . . . , and 121-6 and the number of the second group of metal contacts 122-1, . . . , and 122-6 are six, the present embodiment is merely an example of the present disclosure. Accordingly, in some other embodiments, the number of the first group of metal contacts 121-1, ..., and 121-6 and the number of the second group of metal contacts 122-1, ..., and 122-6 may be less or greater than six.

The first group of metal contacts 121-1, ..., and 121-6 may be arrayed in one column on a first region 104-1 of the isolation layer 104 spaced apart from each other in a first direction (i.e., a vertical direction in FIG. 1). The second group of metal contacts 122-1, ..., and 122-6 may be arrayed in one column on a second region 104-2 of the isolation layer 104 spaced apart from each other along the first direction. Bottom surfaces of the first group of metal contacts 121-1, ..., and 121-6 may be in direct contact with a top surface of the isolation layer 104. Bottom surfaces of the second group of metal contacts 122-1, ..., and 122-6 may also be in direct contact with the top surface of the isolation layer 104.

The first group of metal contacts 121-1, ..., and 121-6 may be spaced apart from the second group of metal contacts 122-1, ..., and 122-6 by a distance "d" in a second direction (i.e., a horizontal direction in FIGS. 1 and 4) intersecting the first direction, respectively. The first and second directions may be orthogonal to each other. An $N^{th}$ metal contact of the first group of metal contacts 121-1, ..., and 121-6 may be spaced apart from an $N^{th}$ metal contact of the second group of metal contacts 122-1, ..., and 122-6 by the distance "d" in the second direction (where, "N" is any one of natural numbers from one to six). For example, the first metal contact 121-1 of the first group of metal contacts 121-1, ..., and 121-6 may be spaced apart from the first metal contact 122-1 of the second group of metal contacts 122-1, ..., and 122-6 by the distance "d" in the second direction. Similarly, the sixth metal contact 121-6 of the first group of metal contacts 121-1, ..., and 121-6 may also be spaced apart from the sixth metal contact 122-6 of the second group of metal contacts 122-1, ..., and 122-6 by the distance "d" in the second direction.

The dielectric layer 130 may surround side surfaces of the first group of metal contacts 121-1, ..., and 121-6 and the second group of metal contacts 122-1, ..., and 122-6. The dielectric layer 130 may be disposed between the first group of metal contacts 121-1, ..., and 121-6 which are arrayed in the first direction as well as between the second group of metal contacts 122-1, ..., and 122-6 which are arrayed in the first direction. In addition, the dielectric layer 130 may be disposed between each of the first group of metal contacts 121-1, ..., and 121-6 and the corresponding one of the second group of metal contacts 122-1, ..., and 122-6, which are adjacent to each other in the second direction. In an embodiment, the dielectric layer 130 may correspond to an interlayer dielectric (ILD) layer. The dielectric layer 130 may include, for example, a silicon dioxide ($SiO_2$) layer.

The first metal electrode 142 may be disposed on the first group of metal contacts 121-1, ..., and 121-6. The first metal electrode 142 may have a planar shape. The first metal electrode 142 may be in direct contact with the top surfaces of the first group of metal contacts 121-1, ..., and 121-6. When a voltage is applied to the first metal electrode 142, the first metal electrode 142 and the first group of metal contacts 121-1, ..., and 121-6 may act as a first electrode of the MIM capacitor 110. The second metal electrode 144 may be disposed on the second group of metal contacts 122-1, ..., and 122-6. The second metal electrode 144 may have a planar shape. The second metal electrode 144 may be in direct contact with the top surfaces of the second group of metal contacts 122-1, ..., and 122-6. When a voltage is applied to the second metal electrode 144, the second metal electrode 144 and the second group of metal contacts 122-1, ..., and 122-6 may act as a second electrode of the MIM capacitor 110.

In an embodiment, the first group of metal contacts 121-1, ..., and 121-6, the second group of metal contacts 122-1, ..., and 122-6, the first metal electrode 142, and the second metal electrode 144 may be made of the same metal material. In an embodiment, the first group of metal contacts 121-1, ..., and 121-6, the second group of metal contacts 122-1, ..., and 122-6, the first metal electrode 142, and the second metal electrode 144 may be formed of a copper (Cu) material, an aluminum (Al) material, a tantalum (Ta) material, a tantalum nitride (TaN) material, a titanium (Ti) material, a titanium nitride (TiN) material, or a combination thereof. In another embodiment, a metal material included in the first group of metal contacts 121-1, ..., and 121-6 and the second group of metal contacts 122-1, ..., and 122-6 may be formed of a metal material that is different from a metal material of the first metal electrode 142 and the second metal electrode 144.

The first electrode of the MIM capacitor 110 may include the first group of metal contacts 121-1, ..., and 121-6 and the first metal electrode 142. The second electrode of the MIM capacitor 110 may include the second group of metal contacts 122-1, ..., and 122-6 and the second metal electrode 144. The dielectric layer 130 of the MIM capacitor 110 may be formed or comprised of an ILD layer. The metal contacts 121-1, ..., 121-6, 122-1, ..., and 122-6, the metal electrodes 142 and 144, and the dielectric layer 130 (corresponding to an ILD layer) may be elements which are employed in general MOS transistors or semiconductor devices such as DRAM devices. Accordingly, the MIM capacitor 110 may be formed during a fabrication process of the general semiconductor devices without using any additional process. Similarly, MIM capacitors according to the following embodiments described hereinafter may also be provided during the fabrication process of the general semiconductor devices without using any additional process.

Figure 5:
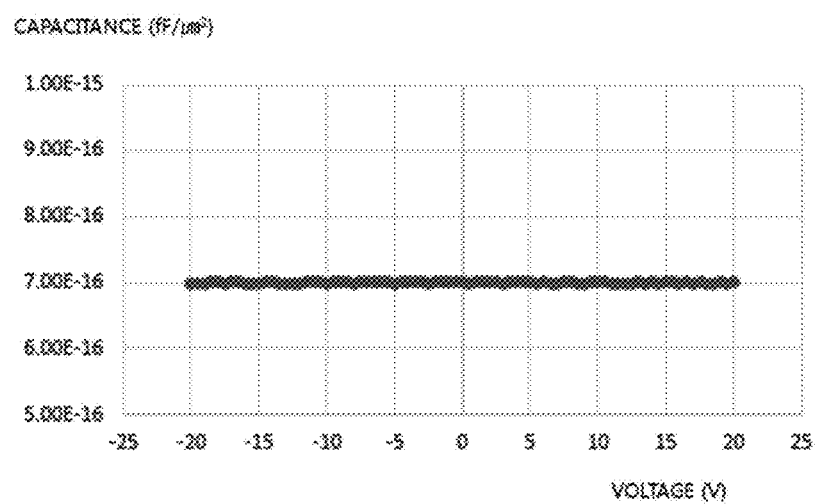
FIG. 5 is a graph illustrating a capacitance-voltage (C-V) characteristic of an MIM capacitor according to an embodiment of the present disclosure.

FIG. 5 is a graph illustrating a C-V plot of an MIM capacitor according to an embodiment of the present disclosure. In the graph of FIG. 5, the abscissa denotes a voltage applied to the MIM capacitor, and the ordinate denotes a capacitance value of the MIM capacitor according to the FIGS. 1-4. As illustrated in FIG. 5, the MIM capacitor exhibited a constant capacitance value of approximately 0.7 $fF/\mu m^2$ in a voltage range of −20V to +20V. That is, the MIM capacitor according to the embodiment of FIGS. 1-4 exhibited a stable capacitance value without any variation of the capacitance value in a general operation voltage range.

Figure 6:
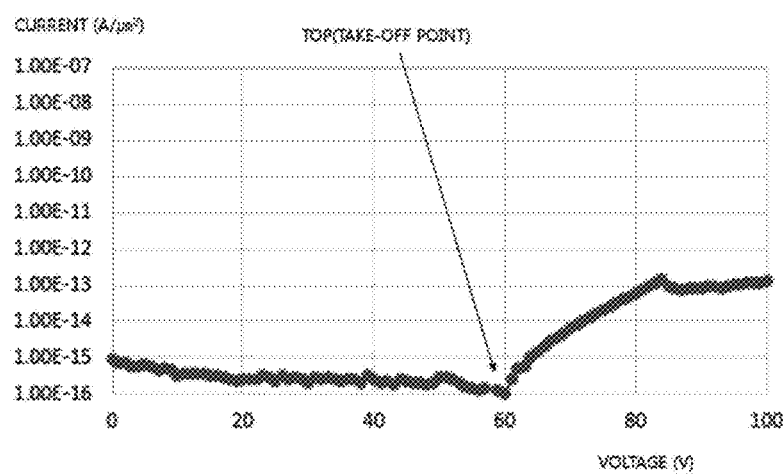
FIG. 6 is a graph illustrating a current-voltage (I-V) characteristic of an MIM capacitor according to an embodiment of the present disclosure.

FIG. 6 is a graph illustrating an I-V characteristic of an MIM capacitor according to the embodiment of FIGS. 1-4 of the present disclosure. In the graph of FIG. 6, the abscissa denotes a voltage applied to the MIM capacitor, and the ordinate denotes a current flowing through the MIM capacitor. As illustrated in FIG. 6, the MIM capacitor exhibited a take-off point (TOP) of approximately 60V at which the current abruptly increases. That is, the MIM capacitor according to an embodiment exhibited a stable characteristic with no abrupt current variation occurring in a general voltage range of from −20V to +20V.

Figure 7:
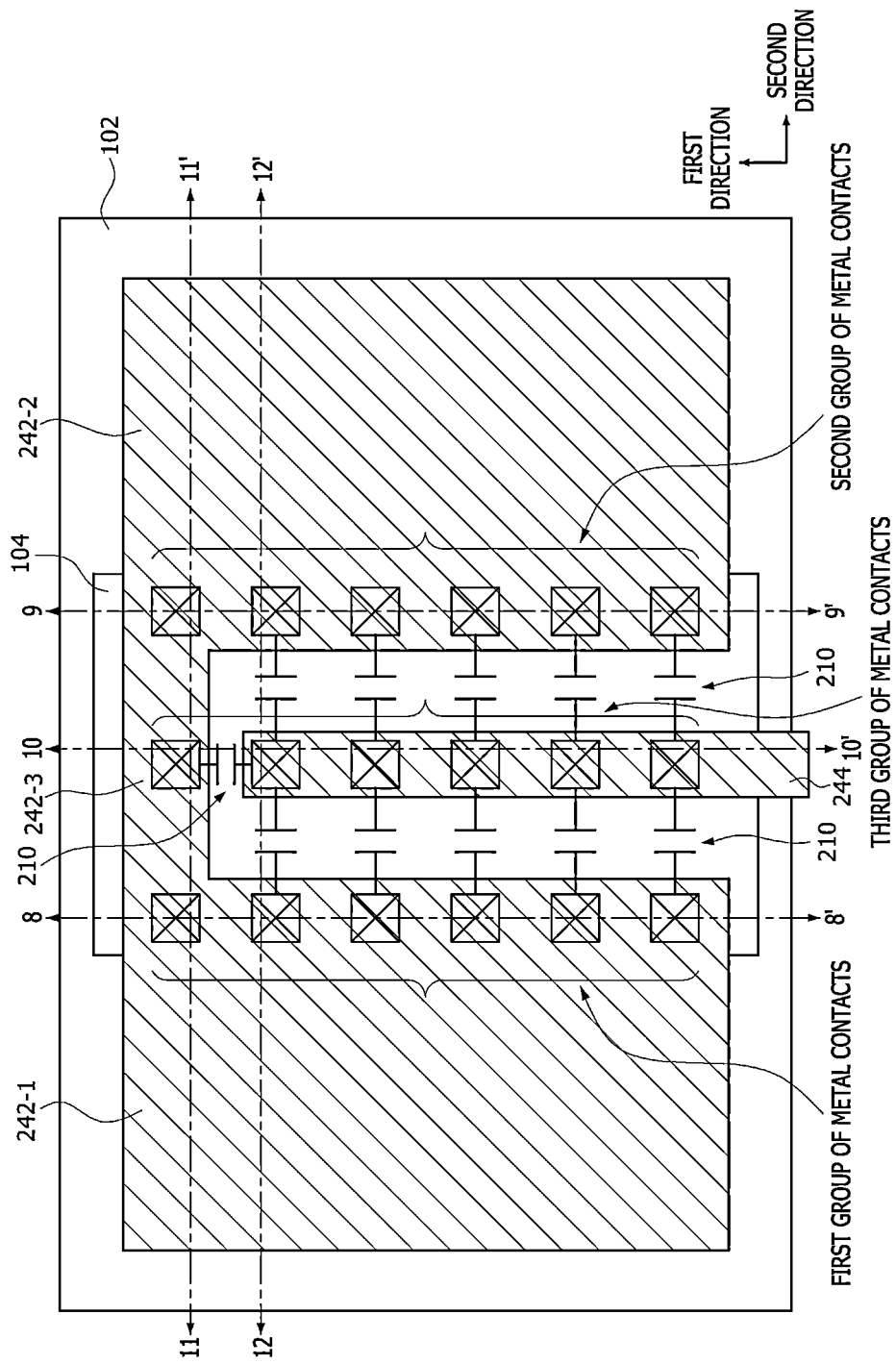
FIG. 7 is a layout diagram illustrating an MIM capacitor according to another embodiment of the present disclosure.
Figure 8:
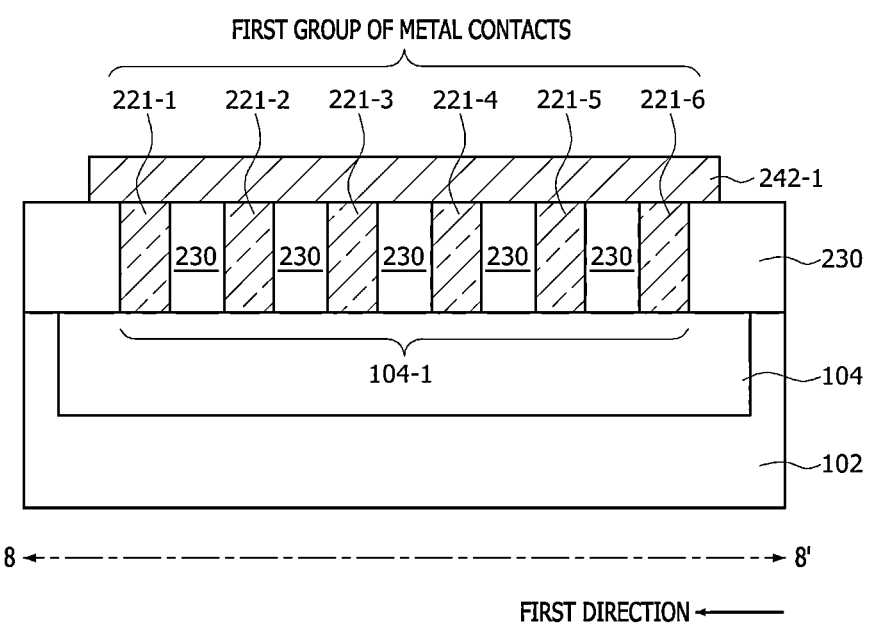
FIG. 8 is a cross-sectional view taken along a line 8-8' of FIG. 7.
Figure 9:
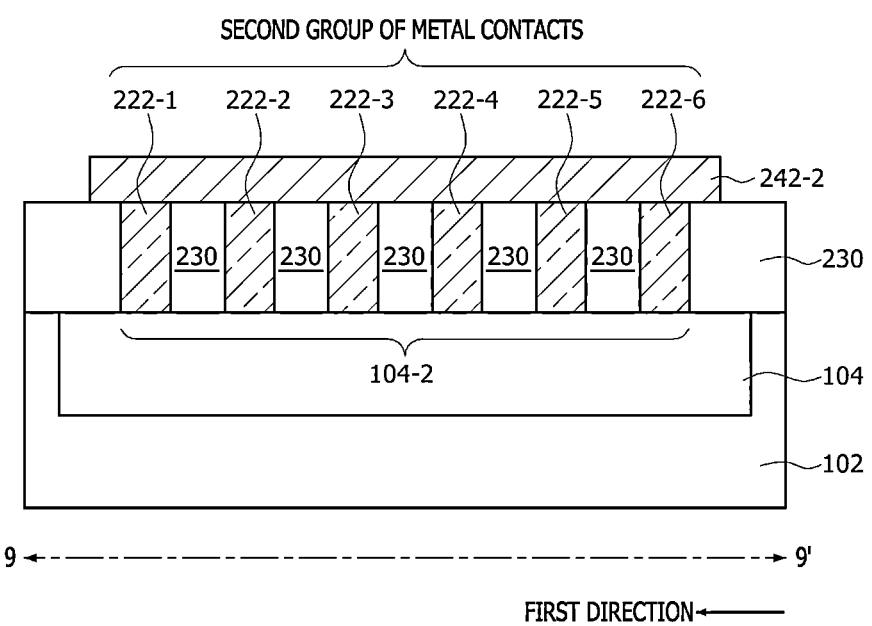
FIG. 9 is a cross-sectional view taken along a line 9-9' of FIG. 7.
Figure 10:
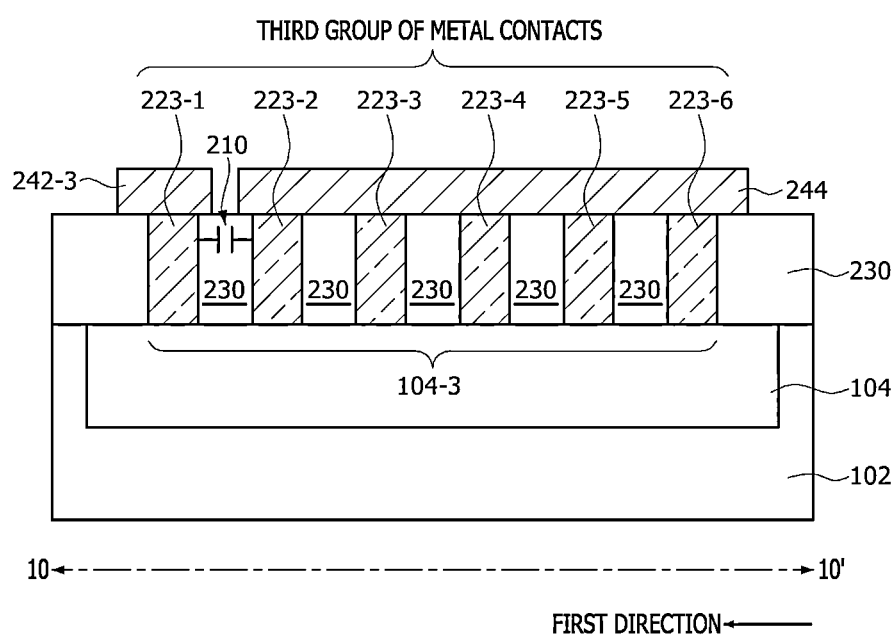
FIG. 10 is a cross-sectional view taken along a line 10-10' of FIG. 7.
Figure 11:
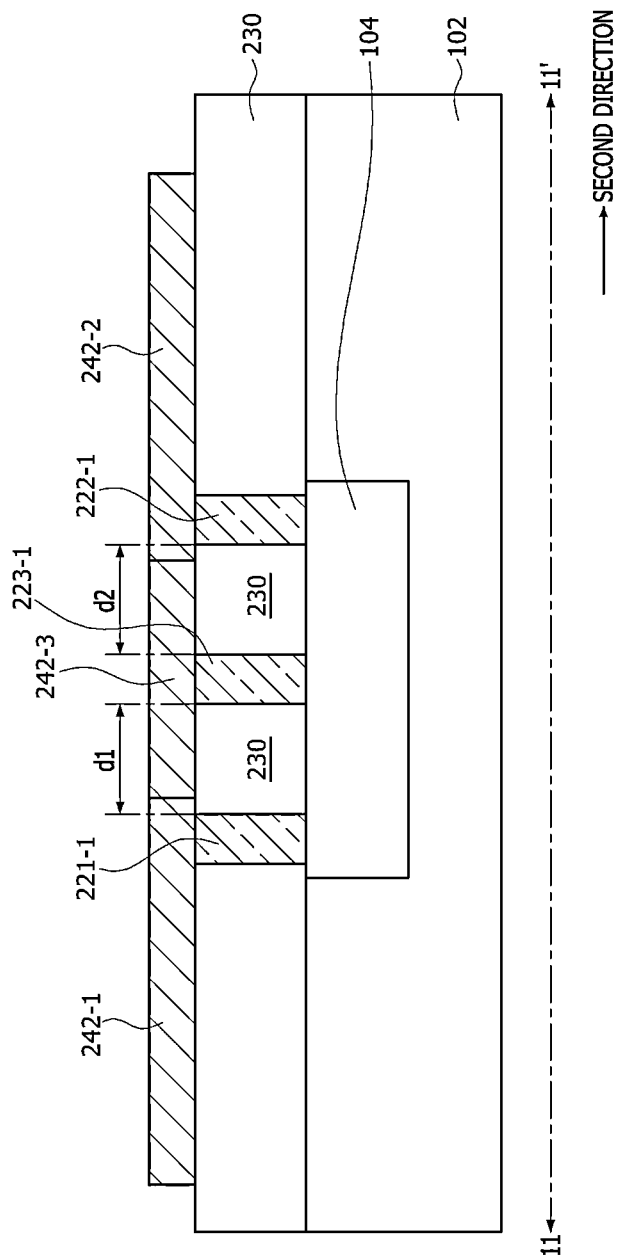
FIG. 11 is a cross-sectional view taken along a line 11-11' of FIG. 7.
Figure 12:
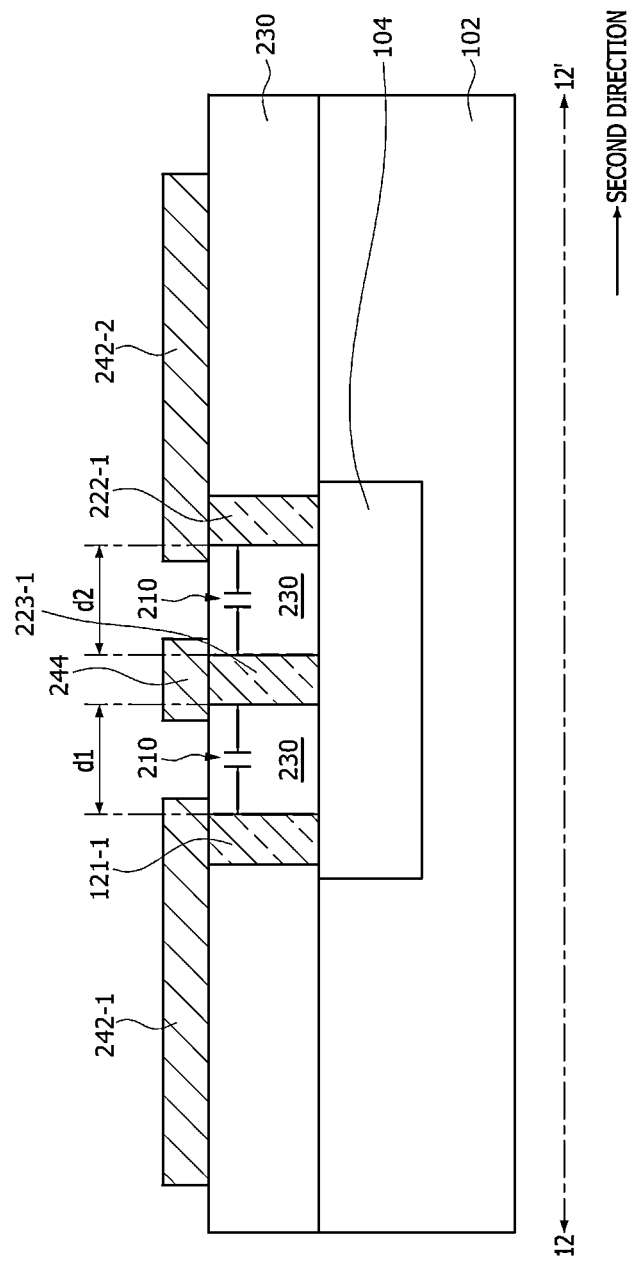
FIG. 12 is a cross-sectional view taken along a line 12-12' of FIG. 7.

FIG. 7 is a layout diagram illustrating an MIM capacitor 210 according to another embodiment of the present disclosure. FIGS. 8 to 12 are cross-sectional views taken along lines 8-8', 9-9', 10-10', 11-11', and 12-12' of FIG. 7, respectively. Referring to FIGS. 7 to 12, the MIM capacitor 210 according to a second embodiment of the present disclosure may be disposed on the isolation layer 104. The isolation layer 104 may be disposed on or in the semiconductor layer 102. In an embodiment, the semiconductor layer 102 may be a semiconductor substrate comprised of a semiconductor material such as a silicon material. In another embodiment, the semiconductor layer 102 may be an impurity diffusion layer which is doped with impurities. The isolation layer 104 may be a shallow trench isolation layer disposed in an upper portion of the semiconductor layer 102. In another embodiment, the isolation layer 104 may protrude from a top surface of the semiconductor layer 102.

The MIM capacitor 210 may include a first group of metal contacts 221-1, . . . , and 221-6, a second group of metal contacts 222-1, . . . , and 222-6, a third group of metal contacts 223-1, . . . , and 223-6, a dielectric layer 230, first metal electrode 242-1, 242-2, and 242-3, and a second metal electrode 244. The number of the first group of metal contacts 221-1, . . . , and 221-6, the number of the second group of metal contacts 222-1, . . . , and 222-6, and the number of the third group of metal contacts 223-1, . . . , and 223-6 may be equal to each other. Although the present embodiment is described in conjunction with a case that the number of the first group of metal contacts 221-1, . . . , and 221-6, the number of the second group of metal contacts 222-1, . . . , and 222-6, and the number of the third group of metal contacts 223-1, . . . , and 223-6 are six, the present embodiment is merely an example of the present disclosure. Accordingly, in some other embodiment, the number of the first group of metal contacts 221-1, . . . , and 221-6, the number of the second group of metal contacts 222-1, . . . , and 222-6, and the number of the third group of metal contacts 223-1, . . . , and 223-6 may be less or greater than six.

The first group of metal contacts 221-1, . . . , and 221-6 may be arrayed in one column on the first region 104-1 of the isolation layer 104 spaced apart from each other in a first direction (i.e., a vertical direction in FIG. 7). The second group of metal contacts 222-1, . . . , and 222-6 may be arrayed in one column on the second region 104-2 of the isolation layer 104 spaced apart from each other along the first direction. The third group of metal contacts 223-1, . . . , and 223-6 may be arrayed in one column on a third region 104-2 of the isolation layer 104 spaced apart from each other along the first direction. The third region 104-2 of the isolation layer 104 may be located between the first region 104-1 and the second region 104-2 of the isolation layer 104. Bottom surfaces of the first group of metal contacts 221-1, . . . , and 221-6 may be in direct contact with a top surface of the isolation layer 104. Bottom surfaces of the second group of metal contacts 222-1, . . . , and 222-6 may also be in direct contact with the top surface of the isolation layer 104. In addition, bottom surfaces of the third group of metal contacts 223-1, . . . , and 223-6 may also be in direct contact with the top surface of the isolation layer 104.

The first group of metal contacts 221-1, . . . , and 221-6 may be spaced apart from the third group of metal contacts 223-1, . . . , and 223-6 by a first distance "d1" in a second direction (i.e., a horizontal direction in FIGS. 7, 11, and 12) intersecting the first direction, respectively. That is, the first group of metal contacts 221-1, . . . , and 221-6 may be disposed to face the third group of metal contacts 223-1, . . . , and 223-6 in the second direction, respectively. The third group of metal contacts 223-1, . . . , and 223-6 may be spaced apart from the second group of metal contacts 222-1, . . . , and 222-6 by a second distance "d2" in the second direction, respectively. That is, the third group of metal contacts 223-1, . . . , and 223-6 may be disposed to face the second group of metal contacts 222-1, . . . , and 222-6 in the second direction, respectively. In an embodiment, the first distance "d1" may be equal to the second distance "d2". An $N^{th}$ metal contact of the first group of metal contacts 221-1, . . . , and 221-6 may be spaced apart from an $N^{th}$ metal contact of the third group of metal contacts 223-1, . . . , and 223-6 by the first distance "d1" in the second direction (where, "N" is any one of natural numbers from one to six). An $N^{th}$ metal contact of the second group of metal contacts 222-1, . . . , and 222-6 may be spaced apart from an $N^{th}$ metal contact of the third group of metal contacts 223-1, . . . , and 223-6 by the second distance "d2" in the second direction (where, "N" is any one of natural numbers from one to six). For example, the first metal contact 221-1 of the first group of metal contacts 221-1, . . . , and 221-6 may be spaced apart from the first metal contact 223-1 of the third group of metal contacts 223-1, . . . , and 223-6 by the first distance "d1" in the second direction. In addition, the first metal contact 222-1 of the second group of metal contacts 222-1, . . . , and 222-6 may be spaced apart from the first metal contact 223-1 of the third group of metal contacts 223-1, . . . , and 223-6 by the second distance "d2" in the second direction.

The dielectric layer 230 may surround all of the side surfaces of the first group of metal contacts 221-1, . . . , and 221-6, the second group of metal contacts 222-1, . . . , and 222-6, and the third group of metal contacts 223-1, . . . , and 223-6. The dielectric layer 230 may be disposed between the first group of metal contacts 221-1, . . . , and 221-6 which are arrayed in the first direction, between the second group of metal contacts 222-1, . . . , and 222-6 which are arrayed in the first direction, and between the third group of metal contacts 223-1, . . . , and 223-6 which are arrayed in the first direction. In addition, the dielectric layer 230 may be disposed between each of the first group of metal contacts 221-1, . . . , and 221-6 and the corresponding one of the third group of metal contacts 223-1, . . . , and 223-6, which are adjacent to each other in the second direction. Furthermore, the dielectric layer 230 may be disposed between each of the second group of metal contacts 222-1, . . . , and 222-6 and the corresponding one of the third group of metal contacts 223-1, . . . , and 223-6, which are adjacent to each other in the second direction. In an embodiment, the dielectric layer 230 may correspond to an interlayer dielectric (ILD) layer. The dielectric layer 230 may include, for example, a silicon dioxide ($SiO_2$) layer.

The first metal electrode 242-1, 242-2, and 242-3 may be disposed on all of the first group of metal contacts 221-1, . . . , and 221-6, all of the second group of metal contacts 222-1, . . . , and 222-6, and the first metal contact 223-1 of the third group of metal contacts 223-1, . . . , and 223-6. The first metal electrode 242-1, 242-2, and 242-3 may have a planar shape. The first metal electrode 242-1, 242-2, and 242-3 may be formed or comprised of a first sub-metal electrode 242-1, a second sub-metal electrode 242-2, and a bridge metal electrode 242-3. The first sub-metal electrode 242-1 may be disposed to be in direct contact with the top surfaces of the first group of metal contacts 221-1, . . . , and 221-6. The second sub-metal electrode 242-2 may be disposed to be in direct contact with the top surfaces of the second group of metal contacts 222-1, . . . , and 222-6. The bridge metal electrode 242-3 may be disposed to be in direct contact with a top surface of the first metal contact 223-1 of the third group of metal contacts 223-1, . . . , and 223-6. The first sub-metal electrode 242-1 and the second sub-metal electrode 242-2 may be electrically coupled to each other by the bridge metal electrode 242-3.

When a voltage is applied to at least one of the first sub-metal electrode 242-1, the second sub-metal electrode 242-2, and the bridge metal electrode 242-3, the first sub-metal electrode 242-1, the second sub-metal electrode 242-2, the bridge metal electrode 242-3, the first group of metal contacts 221-1, ..., and 221-6, the second group of metal contacts 222-1, ..., and 222-6, and the first metal contact 223-1 of the third group of metal contacts 223-1, ..., and 223-6 may act as a first electrode of the MIM capacitor 210.

The second metal electrode 244 may be disposed on the remaining metal contacts (i.e., second to sixth metal contacts 233-2, ..., and 223-6) except an endmost one (i.e., the first metal contact 223-1) among the third group of metal contacts 223-1, ..., and 223-6. The second metal electrode 244 may have a planar shape. The second metal electrode 244 may be in direct contact with the top surfaces of the remaining metal contacts (i.e., the second to sixth metal contacts 233-2, ..., and 223-6) except the first metal contact 223-1 among the third group of metal contacts 223-1, ..., and 223-6. When a voltage is applied to the second metal electrode 244, the second metal electrode 244 and the remaining metal contacts (i.e., the second to sixth metal contacts 233-2, ..., and 223-6) except the first metal contact 223-1 among the third group of metal contacts 223-1, ..., and 223-6 may act as a second electrode of the MIM capacitor 210.

In an embodiment, the first group of metal contacts 221-1, ..., and 221-6, the second group of metal contacts 222-1, ..., and 222-6, the third group of metal contacts 223-1, ..., and 223-6, the first metal electrode 242-1, 242-2, and 242-3, and the second metal electrode 244 may be formed or comprised of the same metal material. In an embodiment, the first group of metal contacts 221-1, ..., and 221-6, the second group of metal contacts 222-1, ..., and 222-6, the third group of metal contacts 223-1, ..., and 223-6, the first metal electrode 242-1, 242-2, and 242-3, and the second metal electrode 244 may be formed or include, for example, a copper (Cu) material, an aluminum (Al) material, a tantalum (Ta) material, a tantalum nitride (TaN) material, a titanium (Ti) material, a titanium nitride (TiN) material, or a combination thereof. In another embodiment, a metal material included in the first group of metal contacts 221-1, ..., and 221-6, the second group of metal contacts 222-1, ..., and 222-6, and the third group of metal contacts 223-1, ..., and 223-6 may be different from a metal material included in the first metal electrode 242-1, 242-2, and 242-3 and the second metal electrode 244.

Figure 13:
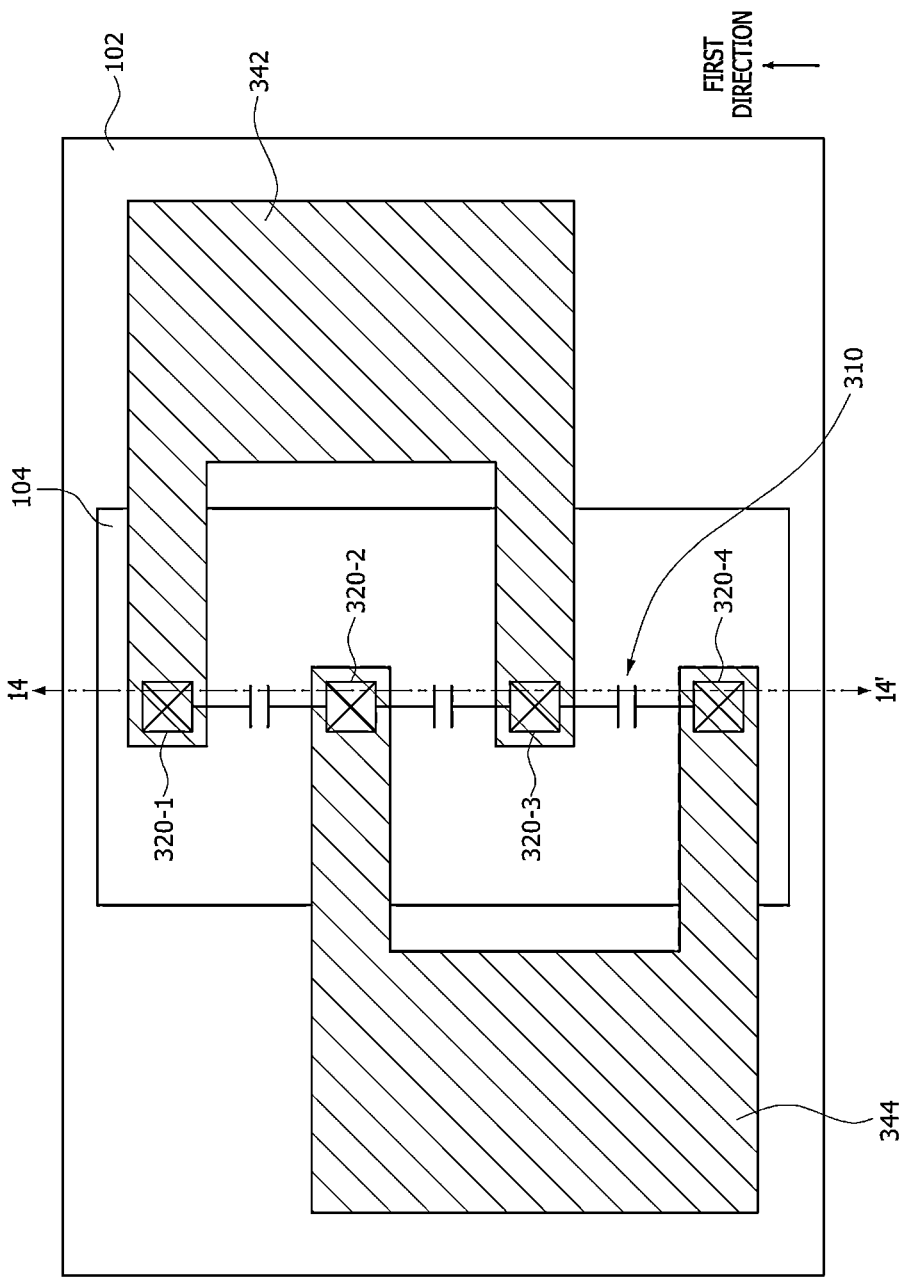
FIG. 13 is a layout diagram illustrating an MIM capacitor according to yet another embodiment of the present disclosure.
Figure 14:
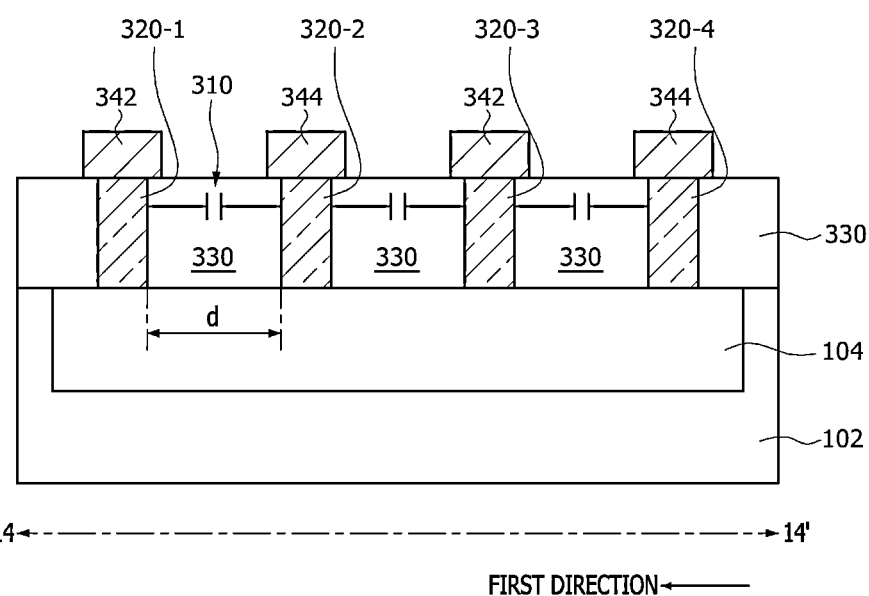
FIG. 14 is a cross-sectional view taken along a line 14-14' of FIG. 13.

FIG. 13 is a layout diagram illustrating an MIM capacitor 310 according to yet another embodiment of the present disclosure. FIG. 14 is a cross-sectional view taken along a line 14-14' of FIG. 13. Referring to FIGS. 13 and 14, the MIM capacitor 310 according to a third embodiment of the present disclosure may be disposed on the isolation layer 104. The isolation layer 104 may be disposed on or in the semiconductor layer 102. In an embodiment, the semiconductor layer 102 may be a semiconductor substrate comprised of a semiconductor material such as a silicon material. In another embodiment, the semiconductor layer 102 may be an impurity diffusion layer which is doped with impurities. The isolation layer 104 may be a shallow trench isolation layer disposed in an upper portion of the semiconductor layer 102. In another embodiment, the isolation layer 104 may protrude from a top surface of the semiconductor layer 102.

The MIM capacitor 310 may include a plurality of metal contacts 320-1, ..., and 320-4, a dielectric layer 330, a first metal electrode 342, and a second metal electrode 344. Although the present embodiment is described in conjunction with a case that the number of the plurality of metal contacts 320-1, ..., and 320-4 is four, the present embodiment is merely an example of the present disclosure. Accordingly, in some other embodiment, the number of the plurality of metal contacts may be less or greater than four. The plurality of metal contacts 320-1, ..., and 320-4 may be arrayed in one column on the isolation layer 104 spaced apart from each other by a distance "d" in a first direction (i.e., a vertical direction in FIG. 13). Thus, the plurality of metal contacts 320-1, ..., and 320-4 may include odd-numbered metal contacts 320-1 and 320-3 and even-numbered metal contacts 320-2 and 320-4 which are alternately arrayed in a first direction. Bottom surfaces of the plurality of metal contacts 320-1, ..., and 320-4 may be in direct contact with a top surface of the isolation layer 104.

The dielectric layer 330 may surround the side surfaces of the plurality of metal contacts 320-1, ..., and 320-4. The dielectric layer 330 may be disposed between the plurality of metal contacts 320-1, ..., and 320-4 which are arrayed in the first direction. In an embodiment, the dielectric layer 330 may correspond to an interlayer dielectric (ILD) layer. The dielectric layer 330 may include, for example, a silicon dioxide ($SiO_2$) layer.

The first metal electrode 342 may be disposed on the odd-numbered metal contacts 320-1 and 320-3 among the plurality of metal contacts 320-1, ..., and 320-4. The first metal electrode 342 may have a planar shape. The first metal electrode 342 may have a planar "H" shape. The first metal electrode 342 may be in direct contact with the top surfaces of the odd-numbered metal contacts 320-1 and 320-3 among the plurality of metal contacts 320-1, ..., and 320-4. When a voltage is applied to the first metal electrode 342, the first metal electrode 342 and the odd-numbered metal contacts 320-1 and 320-3 may act as a first electrode of the MIM capacitor 310. The second metal electrode 344 may be disposed on the even-numbered metal contacts 320-2 and 320-4 among the plurality of metal contacts 320-1, ..., and 320-4. The second metal electrode 344 may have a planar shape. The second metal electrode 344 may have a planar "H" shape. The second metal electrode 344 may be in direct contact with the top surfaces of the even-numbered metal contacts 320-2 and 320-4 among the plurality of metal contacts 320-1, ..., and 320-4. When a voltage is applied to the second metal electrode 344, the second metal electrode 344 and the even-numbered metal contacts 320-2 and 320-4 may act as a second electrode of the MIM capacitor 310.

In an embodiment, the plurality of metal contacts 320-1, ..., and 320-4, the first metal electrode 342, and the second metal electrode 344 may be formed or comprised of the same metal material. In an embodiment, the plurality of metal contacts 320-1, ..., and 320-4, the first metal electrode 342, and the second metal electrode 344 may be formed of or include, for example, a copper (Cu) material, an aluminum (Al) material, a tantalum (Ta) material, a tantalum nitride (TaN) material, a titanium (Ti) material, a titanium nitride (TiN) material, or a combination thereof. In another embodiment, a metal material included in the plurality of metal contacts 320-1, ..., and 320-4 may be different from a metal material included in the first metal electrode 342 and the second metal electrode 344.

Figure 15:
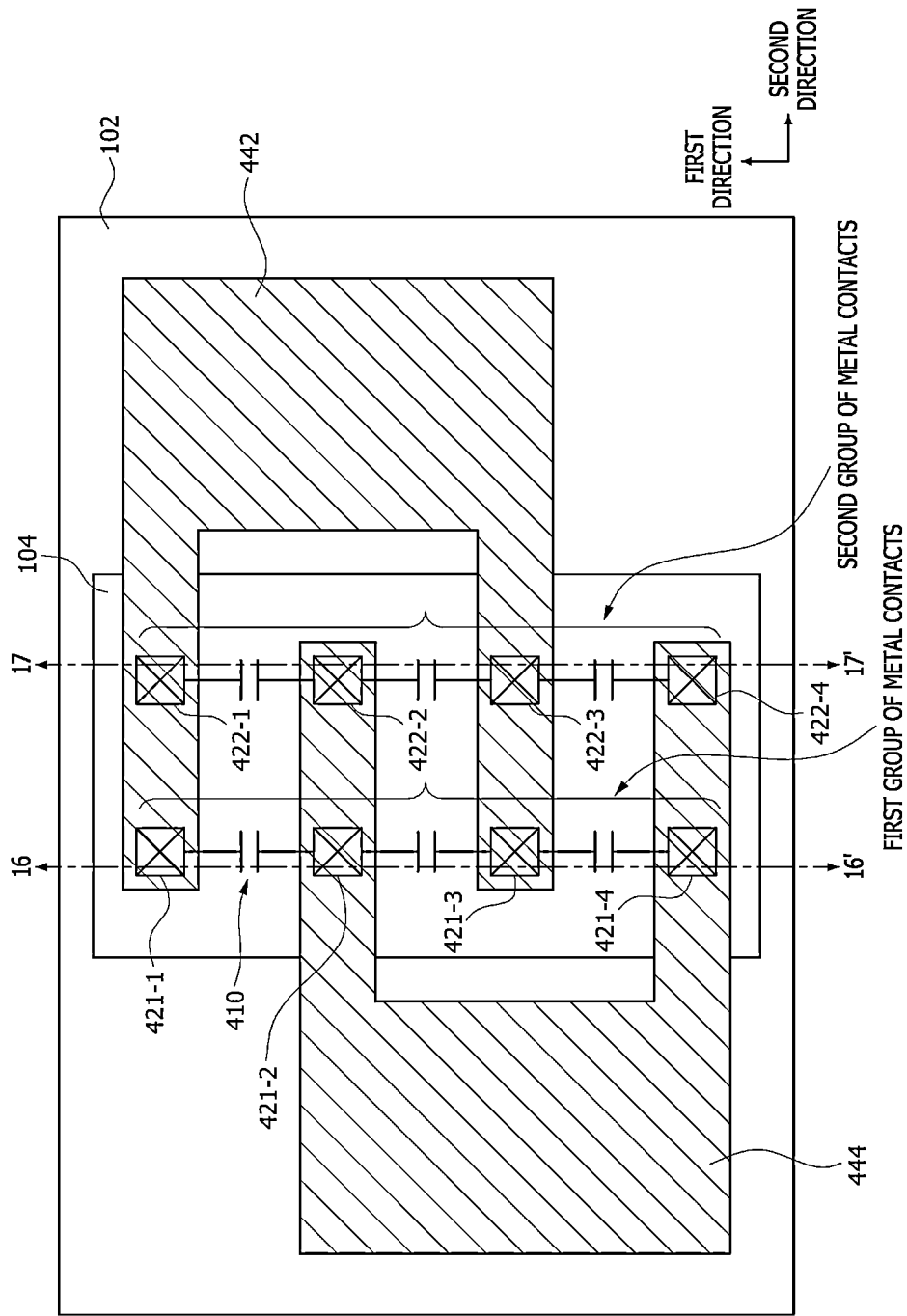
FIG. 15 is a layout diagram illustrating an MIM capacitor according to still another embodiment of the present disclosure.
Figure 16:
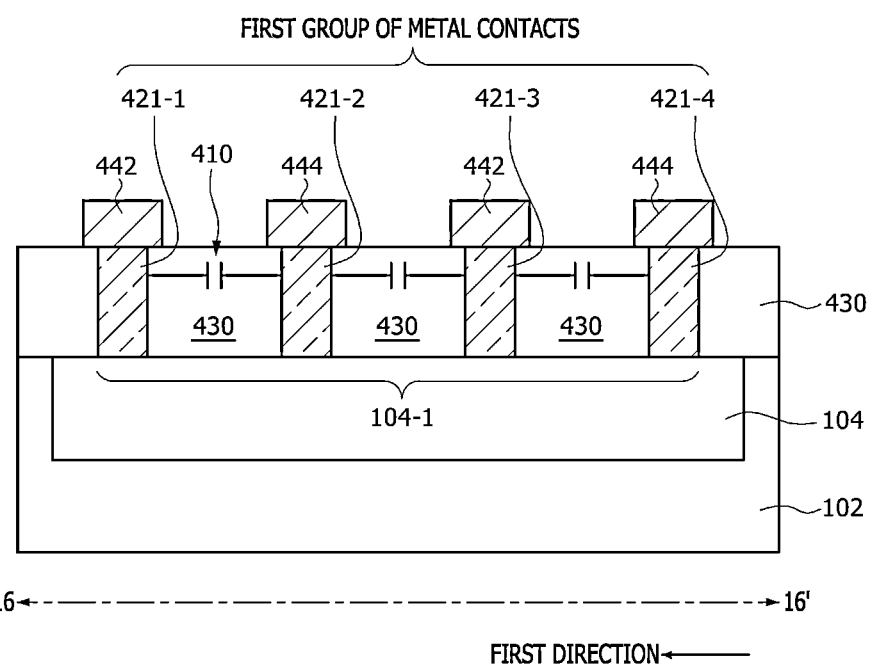
FIG. 16 is a cross-sectional view taken along a line 16-16' of FIG. 15.
Figure 17:
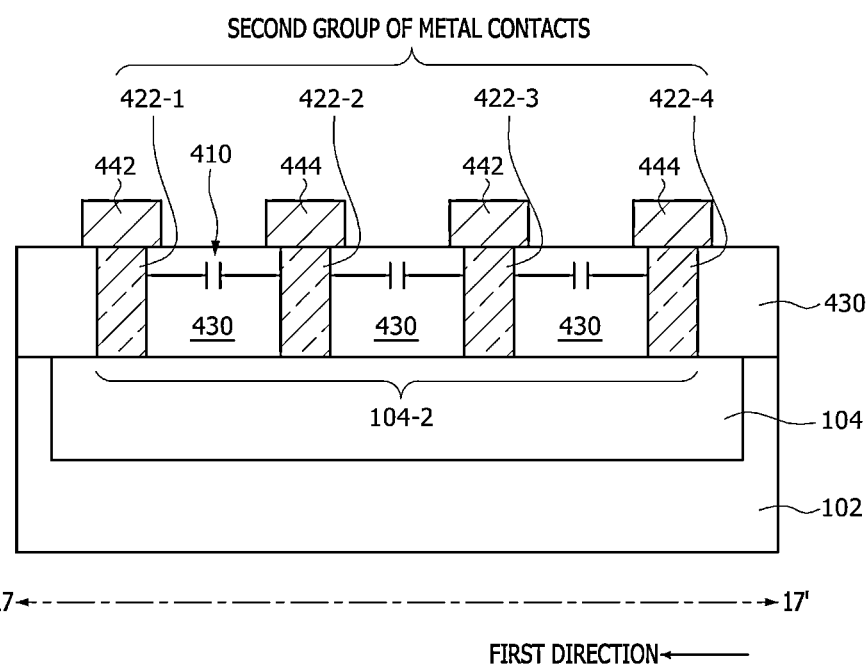
FIG. 17 is a cross-sectional view taken along a line 17-17' of FIG. 15.

FIG. 15 is a layout diagram illustrating an MIM capacitor 410 according to still another embodiment of the present disclosure. FIGS. 16 and 17 are cross-sectional views taken along lines 16-16' and 17-17' of FIG. 15, respectively. Referring to FIGS. 15 to 17, the MIM capacitor 410 according to a fourth embodiment of the present disclosure may be disposed on the isolation layer 104. The isolation layer 104 may be disposed on or in the semiconductor layer 102. In an embodiment, the semiconductor layer 102 may be a semiconductor substrate comprised of a semiconductor material such as a silicon material. In another embodiment, the semiconductor layer 102 may be an impurity diffusion layer which is doped with impurities. The isolation layer 104 may be a shallow trench isolation layer disposed in an upper portion of the semiconductor layer 102. In another embodiment, the isolation layer 104 may protrude from a top surface of the semiconductor layer 102.

The MIM capacitor 410 may include a first group of metal contacts 421-1, . . . , and 421-4, a second group of metal contacts 422-1, . . . , and 422-4, a dielectric layer 430, a first metal electrode 442, and a second metal electrode 444. In an embodiment, the number of the first group of metal contacts 421-1, . . . , and 421-4 may be equal to the number of the second group of metal contacts 422-1, . . . , and 422-4. Although the present embodiment is described in conjunction with a case that the number of the first group of metal contacts 421-1, . . . , and 421-4 and the number of the second group of metal contacts 422-1, . . . , and 422-4 are four, the present embodiment is merely an example of the present disclosure. Accordingly, in some other embodiment, the number of the first group of metal contacts and the number of the second group of metal contacts may be less or greater than four.

The first group of metal contacts 421-1, . . . , and 421-4 may be arrayed in one column on a first region 104-1 of the isolation layer 104 spaced apart from each other in a first direction (i.e., a vertical direction in FIG. 15). Thus, the first group of metal contacts 421-1, . . . , and 421-4 may include odd-numbered metal contacts 421-1 and 421-3 and even-numbered metal contacts 421-2 and 421-4 which are alternately arrayed in the first direction. Bottom surfaces of the first group of metal contacts 421-1, . . . , and 421-4 may be in direct contact with a top surface of the isolation layer 104. The second group of metal contacts 422-1, . . . , and 422-4 may be arrayed in one column on a second region 104-2 of the isolation layer 104 spaced apart from each other in the first direction. Thus, the second group of metal contacts 422-1, . . . , and 422-4 may include odd-numbered metal contacts 422-1 and 422-3 and even-numbered metal contacts 422-2 and 422-4 which are alternately arrayed in the first direction. Bottom surfaces of the second group of metal contacts 422-1, . . . , and 422-4 may be in direct contact with the top surface of the isolation layer 104.

The odd-numbered metal contacts 421-1 and 421-3 of the first group of metal contacts 421-1, . . . , and 421-4 may be spaced apart from the odd-numbered metal contacts 422-1 and 422-3 of the second group of metal contacts 422-1, . . . , and 422-4 in a second direction (i.e., a horizontal direction in FIG. 15) intersecting the first direction, respectively. For example, the first metal contact 421-1 of the first group of metal contacts 421-1, . . . , and 421-4 may be spaced apart from the first metal contact 422-1 of the second group of metal contacts 422-1, . . . , and 422-4 in the second direction. Similarly, the third metal contact 421-3 of the first group of metal contacts 421-1, . . . , and 421-4 may be spaced apart from the third metal contact 422-3 of the second group of metal contacts 422-1, . . . , and 422-4 in the second direction.

The even-numbered metal contacts 421-2 and 421-4 of the first group of metal contacts 421-1, . . . , and 421-4 may be spaced apart from the even-numbered metal contacts 422-2 and 422-4 of the second group of metal contacts 422-1, . . . , and 422-4 in the second direction, respectively. For example, the second metal contact 421-2 of the first group of metal contacts 421-1, . . . , and 421-4 may be spaced apart from the second metal contact 422-2 of the second group of metal contacts 422-1, . . . , and 422-4 in the second direction. Similarly, the fourth metal contact 421-4 of the first group of metal contacts 421-1, . . . , and 421-4 may be spaced apart from the fourth metal contact 422-4 of the second group of metal contacts 422-1, . . . , and 422-4 in the second direction.

The dielectric layer 430 may surround all of the side surfaces of the first group of metal contacts 421-1, . . . , and 421-4 and the second group of metal contacts 422-1, . . . , and 422-4. The dielectric layer 430 may be disposed between the first group of metal contacts 421-1, . . . , and 421-4 which are arrayed in the first direction. The dielectric layer 430 may also be disposed between the second group of metal contacts 422-1, . . . , and 422-4 which are arrayed in the first direction. In addition, the dielectric layer 430 may be disposed between each of the first group of metal contacts 421-1, . . . , and 421-4 and the corresponding one of the second group of metal contacts 422-1, . . . , and 422-4, which are adjacent to each other in the second direction. In an embodiment, the dielectric layer 430 may correspond to an interlayer dielectric (ILD) layer. The dielectric layer 430 may include, for example, a silicon dioxide ($SiO_2$) layer.

The first metal electrode 442 may be disposed on the odd-numbered metal contacts 421-1 and 421-3 among the first group of metal contacts 421-1, . . . , and 421-4 as well as the odd-numbered metal contacts 422-1 and 422-3 among the second group of metal contacts 422-1, . . . , and 422-4. The first metal electrode 442 may have a planar shape. The first metal electrode 442 may have a planar "π" shape. The first metal electrode 442 may be in direct contact with the top surfaces of the odd-numbered metal contacts 421-1 and 421-3 among the first group of metal contacts 421-1, . . . , and 421-4 and the top surfaces of the odd-numbered metal contacts 422-1 and 422-3 among the second group of metal contacts 422-1, . . . , and 422-4. When a voltage is applied to the first metal electrode 442, the first metal electrode 442 and the odd-numbered metal contacts 421-1, 421-3, 422-1, and 422-3 among the first and second groups of metal contacts 421-1, . . . , 421-4, 422-1, . . . , and 422-4 may act as a first electrode of the MIM capacitor 410.

The second metal electrode 444 may be disposed on the even-numbered metal contacts 421-2 and 421-4 among the first group of metal contacts 421-1, . . . , and 421-4 as well as the even-numbered metal contacts 422-2 and 422-4 among the second group of metal contacts 422-1, . . . , and 422-4. The second metal electrode 444 may have a planar shape. The second metal electrode 444 may have a "π" planar shape. The second metal electrode 444 may be in direct contact with the top surfaces of the even-numbered metal contacts 421-2 and 421-4 among the first group of metal contacts 421-1, . . . , and 421-4 and the top surfaces of the even-numbered metal contacts 422-2 and 422-4 among the second group of metal contacts 422-1, . . . , and 422-4. When a voltage is applied to the second metal electrode 444, the second metal electrode 444 and the even-numbered metal contacts 421-2, 421-4, 422-2, and 422-4 among the first and second groups of metal contacts 421-1, . . . , 421-4, 422-1, . . . , and 422-4 may act as a second electrode of the MIM capacitor 410.

In an embodiment, the first and second groups of metal contacts 421-1, . . . , 421-4, 422-1, . . . , and 422-4, the first metal electrode 442, and the second metal electrode 444 may be formed or comprised of the same metal material. In an embodiment, the first and second groups of metal contacts 421-1, . . . , 421-4, 422-1, . . . , and 422-4, the first metal electrode 442, and the second metal electrode 444 may be formed of or include, for example, a copper (Cu) material, an aluminum (Al) material, a tantalum (Ta) material, a tantalum nitride (TaN) material, a titanium (Ti) material, a titanium nitride (TiN) material, or a combination thereof. In another embodiment, a metal material included in the first and second groups of metal contacts 421-1, . . . , 421-4, 422-1, . . . , and 422-4 may be different from a metal material included in the first metal electrode 442 and the second metal electrode 444.

Figure 18:
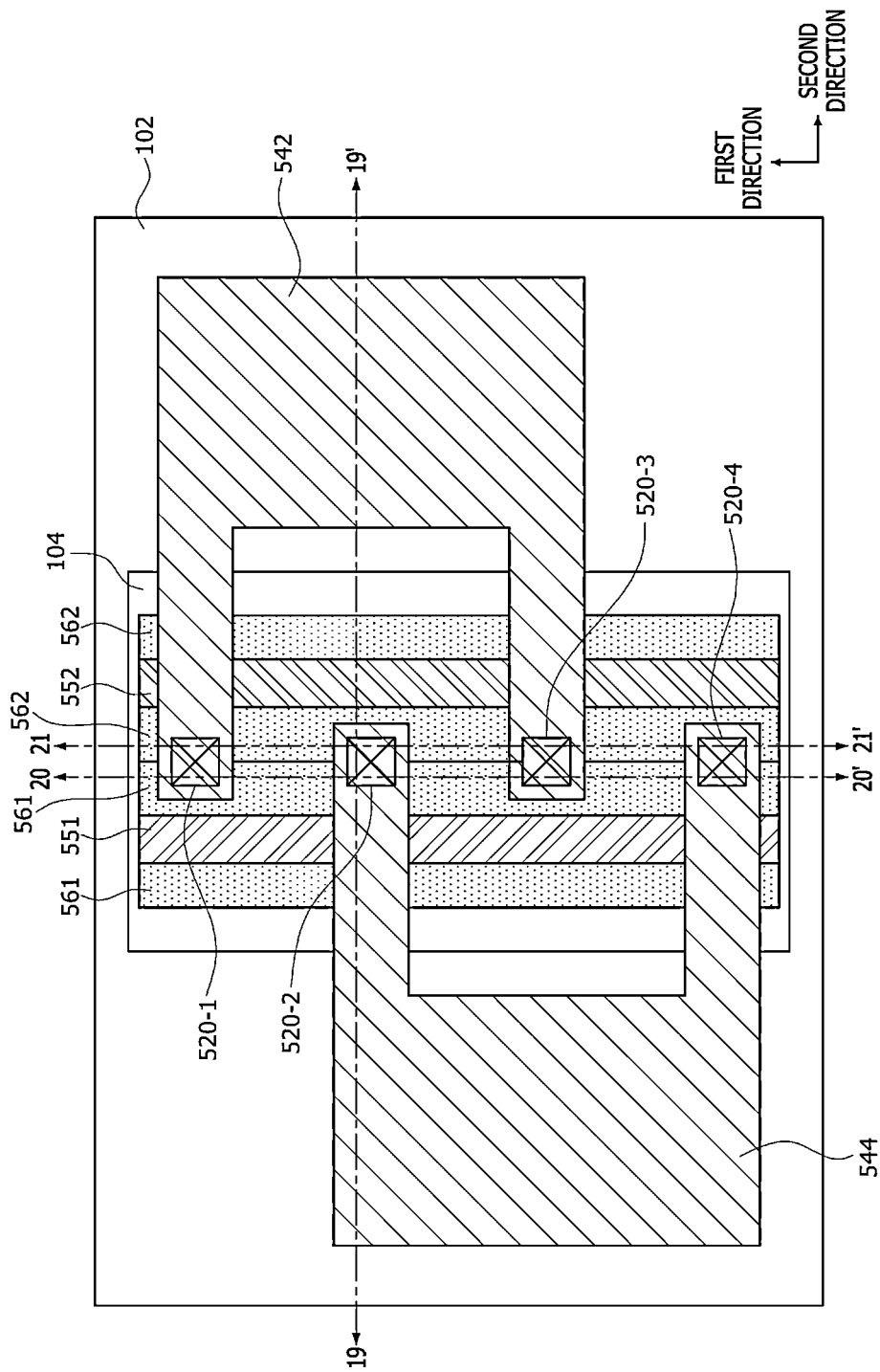
FIG. 18 is a layout diagram illustrating an MIM capacitor according to yet still another embodiment of the present disclosure.
Figure 19:
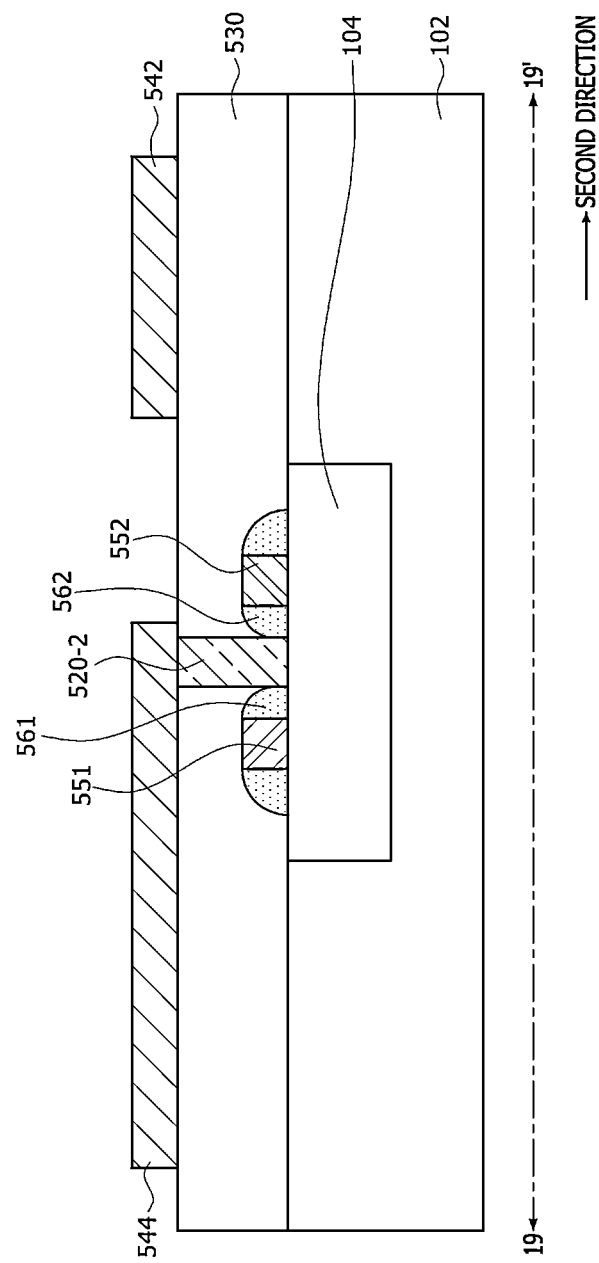
FIG. 19 is a cross-sectional view taken along a line 19-19' of FIG. 18.
Figure 20:
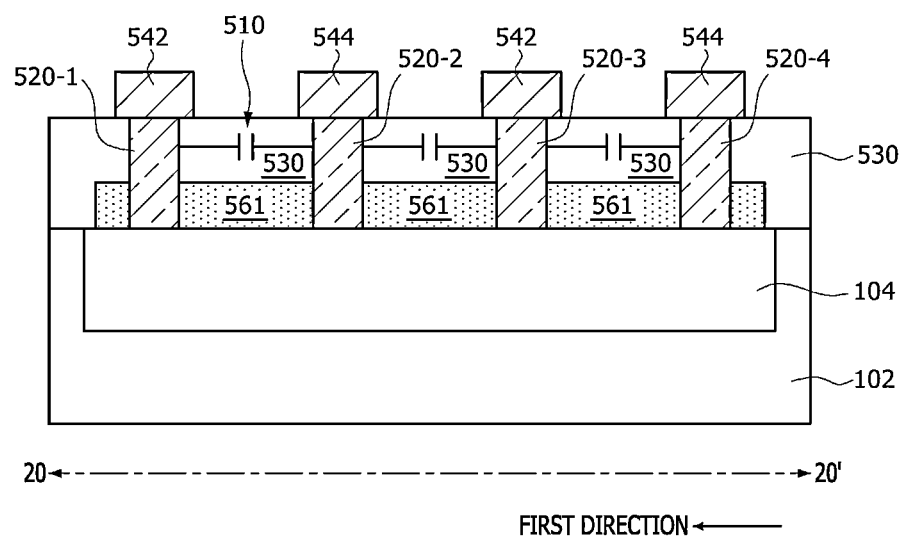
FIG. 20 is a cross-sectional view taken along a line 20-20' of FIG. 18.
Figure 21:
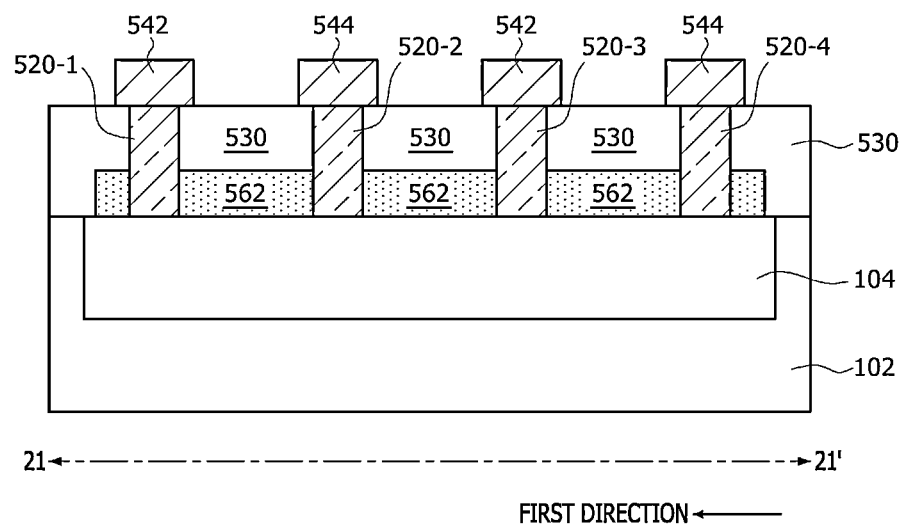
FIG. 21 is a cross-sectional view taken along a line 21-21' of FIG. 18.

FIG. 18 is a layout diagram illustrating an MIM capacitor 510 according to yet still another embodiment of the present disclosure. FIGS. 19 to 21 are cross-sectional views taken along lines 19-19', 20-20', and 21-21' of FIG. 18, respectively. Referring to FIGS. 18 to 21, the MIM capacitor 510 according to a fifth embodiment of the present disclosure may be disposed on the isolation layer 104. The isolation layer 104 may be disposed on or in the semiconductor layer 102. In an embodiment, the semiconductor layer 102 may be a semiconductor substrate comprised of a semiconductor material such as a silicon material. In another embodiment, the semiconductor layer 102 may be an impurity diffusion layer which is doped with impurities. The isolation layer 104 may be a shallow trench isolation layer disposed in an upper portion of the semiconductor layer 102. In another embodiment, the isolation layer 104 may protrude from a top surface of the semiconductor layer 102.

The MIM capacitor 510 may include a plurality of metal contacts 520-1, . . . , and 520-4, a dielectric layer 530, a first metal electrode 542, a second metal electrode 544, a first sidewall spacer 561, and a second sidewall spacer 562. The MIM capacitor 510 according to the present embodiment may be different from the MIM capacitors 110, 210, 310, and 410 according to the first to fourth embodiments in terms of a configuration of a capacitive dielectric material disposed between two electrodes. That is, while each of the MIM capacitors 110, 210, 310, and 410 according to the first to fourth embodiments employs a single dielectric material as a capacitive dielectric material, the MIM capacitor 510 according to the present embodiment may employ a hybrid dielectric material as a capacitive dielectric material. In an embodiment, a capacitive dielectric material of the MIM capacitor 510 may include the first sidewall spacer 561 disposed on side surfaces of a first conductive pattern 551, the second sidewall spacer 562 disposed on side surfaces of a second conductive pattern 552, and the dielectric layer 530. In an embodiment, the first conductive pattern 551 and the second conductive pattern 552 may be provided while gate electrodes of general MOS transistors are formed on other portions of the semiconductor layer 102, and the first sidewall spacer 561 and the second sidewall spacer 562 may also be provided while gate spacers of the general MOS transistors are formed on the other portions of the semiconductor layer 102. Accordingly, the MIM capacitor 510 may be provided by a fabrication process of general semiconductor devices without using any additional process. In an embodiment, each of the first and second conductive patterns 551 and 552 may be formed of or include, for example, a doped polysilicon layer.

The first conductive pattern 551 may be disposed on the isolation layer 104 to extend in a first direction and have an elongated line shape (i.e., a vertical direction in FIG. 18). The first sidewall spacer 561 may be disposed on side surfaces of the first conductive pattern 551. The second conductive pattern 552 may be disposed on the isolation layer 104 to extend in a first direction and have an elongated line shape. The second sidewall spacer 562 may be disposed on side surfaces of the second conductive pattern 552. The first conductive pattern 551 and the second conductive pattern 552 may be spaced apart from each other in a second direction (i.e., a horizontal direction in FIG. 18) intersecting the first direction.

The first sidewall spacer 561 and the second sidewall spacer 562 may include an insulation material having a dielectric constant which is higher than a dielectric constant of the dielectric layer 530. In an embodiment, the first sidewall spacer 561 and the second sidewall spacer 562 may include a nitride layer. The first sidewall spacer 561 and the second sidewall spacer 562 disposed between the first conductive pattern 551 and the second conductive pattern 552 may contact each other or may be spaced apart from each other in the second direction.

The plurality of metal contacts 520-1, . . . , and 520-4 may be arrayed in one column on the isolation layer 104 spaced apart from each other in the first direction (i.e., a vertical direction in FIG. 18). Thus, the plurality of metal contacts 520-1, . . . , and 520-4 may include odd-numbered metal contacts 520-1 and 520-3 and even-numbered metal contacts 520-2 and 520-4 which are alternately arrayed in the first direction. Each of the plurality of metal contacts 520-1, . . . , and 520-4 may penetrate the dielectric layer 530, the first sidewall spacer 561, and the second sidewall spacer 562. Thus, bottom surfaces of the plurality of metal contacts 520-1, . . . , and 520-4 may be in direct contact with the top surface of the isolation layer 104. A lower side surface of each of the plurality of metal contacts 520-1, . . . , and 520-4 may be surrounded by the first sidewall spacer 561 and the second sidewall spacer 562. Although the present embodiment is described in conjunction with a case that the number of the plurality of metal contacts 520-1, . . . , and 520-4 is four, the present embodiment is merely an example of the present disclosure. Accordingly, in some other embodiment, the number of the plurality of metal contacts may be less or greater than four.

The dielectric layer 530 may be disposed on both of the first and second sidewall spacers 561 and 562 to surround side surfaces of the plurality of metal contacts 520-1, . . . , and 520-4. The dielectric layer 530 may be disposed on both of the first and second sidewall spacers 561 and 562 to fill spaces between the plurality of metal contacts 520-1, . . . , and 520-4 which are arrayed in the first direction. That is, the first and second sidewall spacers 561 and 562 may be disposed in a lower portion of each of spaces between the plurality of metal contacts 520-1, . . . , and 520-4, and the dielectric layer 530 may be disposed in an upper portion of each of spaces between the plurality of metal contacts 520-1, . . . , and 520-4. In an embodiment, the dielectric layer 530 may correspond to an interlayer dielectric (ILD) layer. The dielectric layer 530 may include, for example, a silicon dioxide ($SiO_2$) layer. The dielectric layer 530 and the first and second sidewall spacers 561 and 562 may act as a capacitive dielectric material of the MIM capacitor 510.

The first metal electrode 542 may be disposed on the odd-numbered metal contacts 520-1 and 520-3 among the plurality of metal contacts 520-1, . . . , and 520-4. The first metal electrode 542 may have a planar shape. The first metal electrode 542 may have a planar "π" shape. The first metal electrode 542 may be in direct contact with the top surfaces of the odd-numbered metal contacts 520-1 and 520-3 among the plurality of metal contacts 520-1, . . . , and 520-4. When a voltage is applied to the first metal electrode 542, the first metal electrode 542 and the odd-numbered metal contacts 520-1 and 520-3 may act as a first electrode of the MIM capacitor 510. The second metal electrode 544 may be disposed on the even-numbered metal contacts 520-2 and 520-4 among the plurality of metal contacts 520-1, ..., and 520-4. The second metal electrode 544 may have a planar shape, e.g., a planar "π" shape. The second metal electrode 544 may be in direct contact with the top surfaces of the even-numbered metal contacts 520-2 and 520-4 among the plurality of metal contacts 520-1, ..., and 520-4. When a voltage is applied to the second metal electrode 544, the second metal electrode 544 and the even-numbered metal contacts 520-2 and 520-4 may act as a second electrode of the MIM capacitor 510.

In an embodiment, the plurality of metal contacts 520-1, ..., and 520-4, the first metal electrode 542, and the second metal electrode 544 may be formed or comprised of the same metal material. In an embodiment, the plurality of metal contacts 520-1, ..., and 520-4, the first metal electrode 542, and the second metal electrode 544 may be formed of or include, for example, a copper (Cu) material, an aluminum (Al) material, a tantalum (Ta) material, a tantalum nitride (TaN) material, a titanium (Ti) material, a titanium nitride (TiN) material, or a combination thereof. In another embodiment, a metal material included in the plurality of metal contacts 520-1, ..., and 520-4 may be different from a metal material included in the first metal electrode 542 and the second metal electrode 544.

Figure 22:
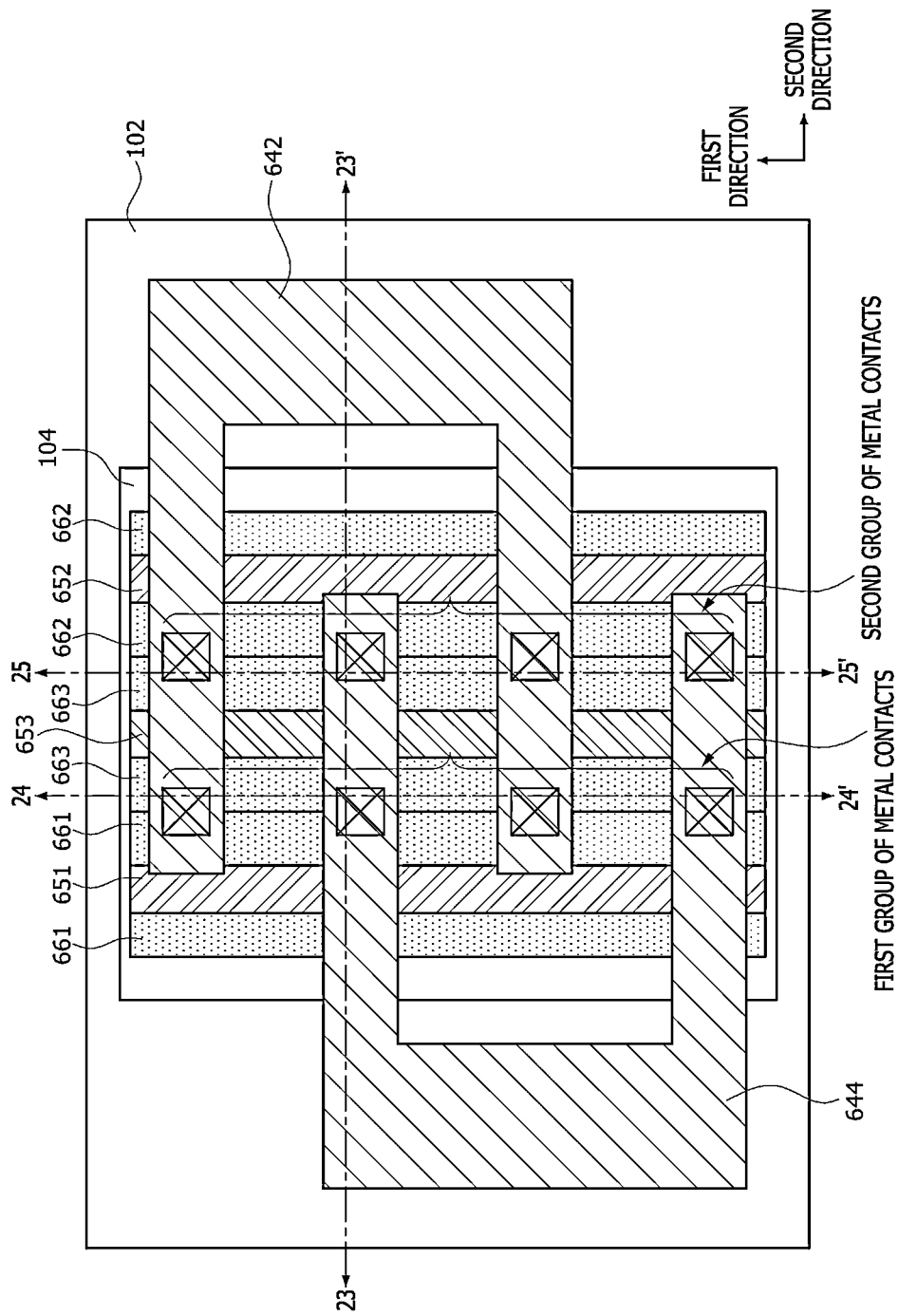
FIG. 22 is a layout diagram illustrating an MIM capacitor according to further another embodiment of the present disclosure.
Figure 23:
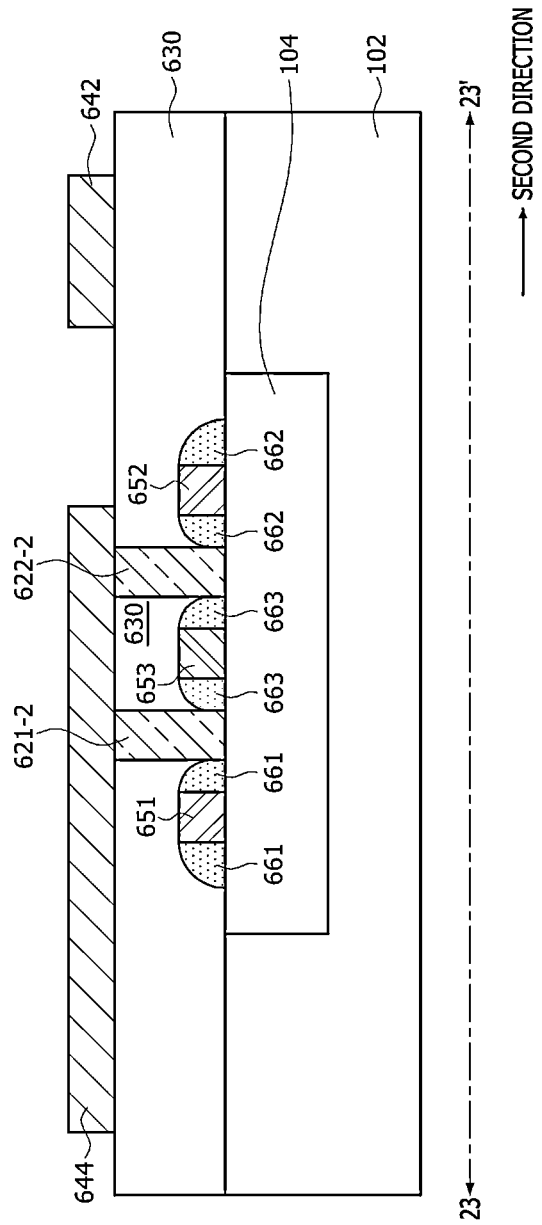
FIG. 23 is a cross-sectional view taken along a line 23-23' of FIG. 22.
Figure 24:
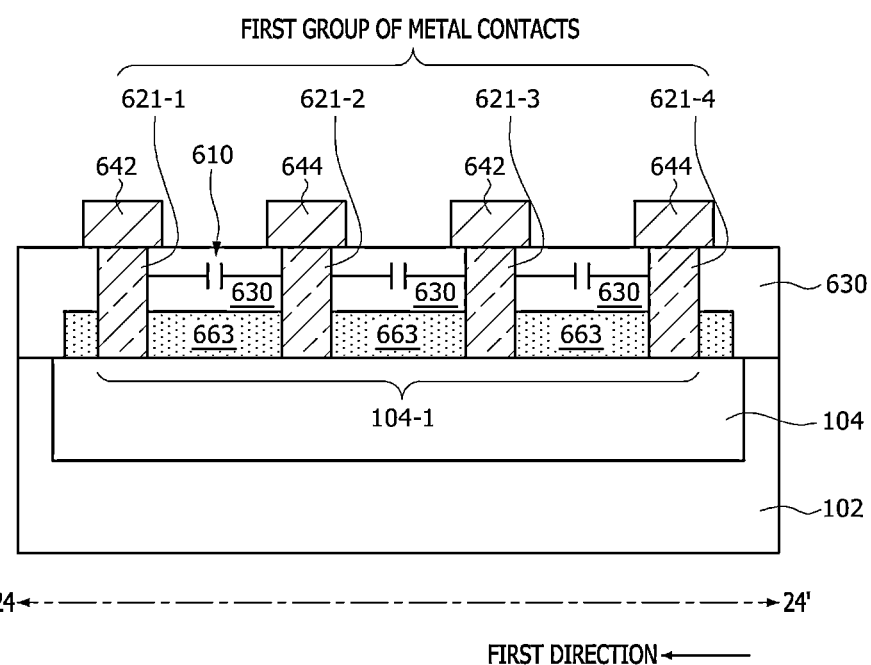
FIG. 24 is a cross-sectional view taken along a line 24-24' of FIG. 22.
Figure 25:
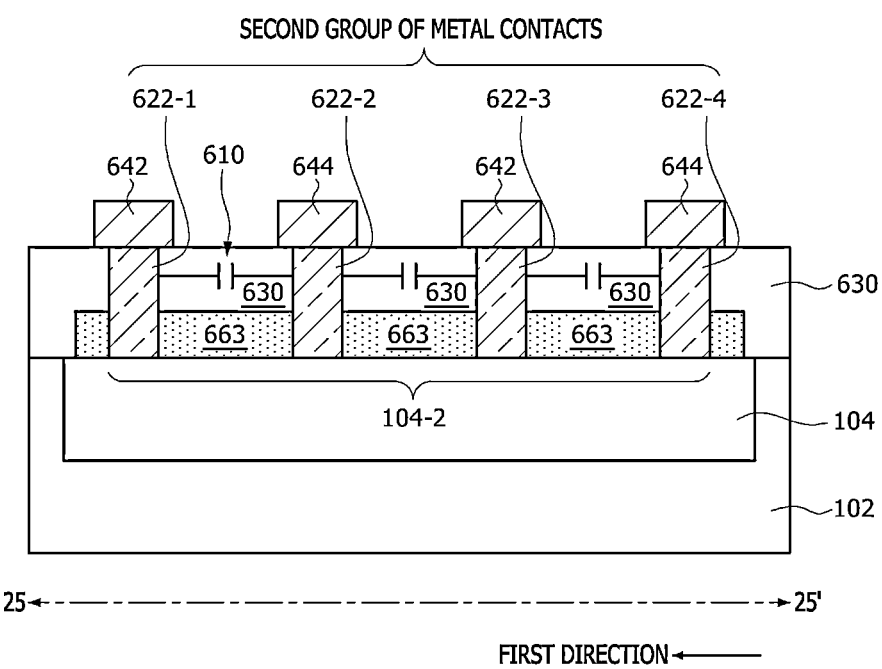
FIG. 25 is a cross-sectional view taken along a line 25-25' of FIG. 22.

FIG. 22 is a layout diagram illustrating an MIM capacitor 610 according to further another embodiment of the present disclosure. FIGS. 23 to 25 are cross-sectional views taken along lines 23-23', 24-24', and 25-25' of FIG. 22, respectively. Referring to FIGS. 22 to 25, the MIM capacitor 610 according to a sixth embodiment of the present disclosure may be disposed on the isolation layer 104. The isolation layer 104 may be disposed on or in the semiconductor layer 102. In an embodiment, the semiconductor layer 102 may be a semiconductor substrate comprised of a semiconductor material such as a silicon material. In another embodiment, the semiconductor layer 102 may be an impurity diffusion layer which is doped with impurities. The isolation layer 104 may be a shallow trench isolation layer disposed in an upper portion of the semiconductor layer 102. In another embodiment, the isolation layer 104 may protrude from a top surface of the semiconductor layer 102.

The MIM capacitor 610 may include a first group of metal contacts 621-1, ..., and 621-4, a second group of metal contacts 622-1, ..., and 622-4, a dielectric layer 630, a first metal electrode 642, a second metal electrode 644, a first sidewall spacer 661, and a second sidewall spacer 662, and a third sidewall spacer 663. The MIM capacitor 610 according to the present embodiment may be different from the MIM capacitor 510 according to the previous embodiment in terms of an array of metal contacts constituting two electrodes. That is, while the MIM capacitor 510 according to the previous embodiment includes the plurality of metal contacts 520-1, ..., and 520-4 which are arrayed in a single column, the MIM capacitor 610 may include the first and second groups of metal contacts 621-1, ..., 621-4, 622-1, ..., and 622-4 which are arrayed in at least two columns. The first sidewall spacer 661 may be disposed on side surfaces of the first conductive pattern 651, the second sidewall spacer 662 may be disposed on side surfaces of the second conductive pattern 652, and the third sidewall spacer 663 may be disposed on side surfaces of the third conductive pattern 653. In an embodiment, the first to third conductive patterns 651, 652, and 653 may be provided while gate electrodes of general MOS transistors are formed on other portions of the semiconductor layer 102, and the first to third sidewall spacers 661, 662, and 663 may also be provided while gate spacers of the general MOS transistors are formed on the other portions of the semiconductor layer 102. Accordingly, the MIM capacitor 610 may also be provided by a fabrication process of general semiconductor devices without using any additional process. In an embodiment, each of the first to third conductive patterns 651, 652, and 653 may be formed or include, for example, a doped polysilicon layer.

The first conductive pattern 651 may be disposed on the isolation layer 104 to extend in a first direction and have an elongated line shape (i.e., a vertical direction in FIG. 22). The first sidewall spacer 661 may be disposed on side surfaces of the first conductive pattern 651. The second conductive pattern 652 may be disposed on the isolation layer 104 to extend in a first direction, and have an elongated line shape. The second sidewall spacer 662 may be disposed on side surfaces of the second conductive pattern 652. The first conductive pattern 651 and the second conductive pattern 652 may be spaced apart from each other in a second direction (i.e., a horizontal direction in FIG. 22) intersecting the first direction. The third conductive pattern 653 may be disposed on the isolation layer 104 to extend in a first direction and have an elongated line shape. The third sidewall spacer 663 may be disposed on side surfaces of the third conductive pattern 653. The first to third conductive patterns 651, 652, and 653 may be spaced apart from each other in the second direction. In an embodiment, the third conductive pattern 653 may be disposed between the first and second conductive patterns 651 and 652.

The first sidewall spacer 661, the second sidewall spacer 662, and the third sidewall spacer 663 may include an insulation material having a dielectric constant which is higher than a dielectric constant of the dielectric layer 630. In an embodiment, the first sidewall spacer 661, the second sidewall spacer 662, and the third sidewall spacer 663 may include a nitride layer. The first sidewall spacer 661 and the third sidewall spacer 663 disposed between the first conductive pattern 651 and the third conductive pattern 653 may contact each other or may be spaced apart from each other in the second direction. The second sidewall spacer 662 and the third sidewall spacer 663 disposed between the second conductive pattern 652 and the third conductive pattern 653 may contact each other or may be spaced apart from each other in the second direction.

The first group of metal contacts 621-1, ..., and 621-4 may be arrayed in one column on a first region 104-1 of the isolation layer 104 spaced apart from each other in the first direction. Thus, the first group of metal contacts 621-1, ..., and 621-4 may include odd-numbered metal contacts 621-1 and 621-3 and even-numbered metal contacts 621-2 and 621-4 which are alternately arrayed in the first direction. Each of the first group of metal contacts 621-1, ..., and 621-4 may penetrate the dielectric layer 630, the first sidewall spacer 661, and the third sidewall spacer 663. Thus, bottom surfaces of the first group of metal contacts 621-1, ..., and 621-4 may be in direct contact with a top surface of the isolation layer 104. The second group of metal contacts 622-1, ..., and 622-4 may be arrayed in one column on a second region 104-2 of the isolation layer 104 spaced apart from each other in the first direction. Thus, the second group of metal contacts 622-1, ..., and 622-4 may include odd-numbered metal contacts 622-1 and 622-3 and even-numbered metal contacts 622-2 and 622-4 which are alternately arrayed in the first direction. Each of the second group of metal contacts 622-1, ..., and 622-4 may penetrate the dielectric layer 630, the second sidewall spacer 662, and the third sidewall spacer 663. Thus, bottom surfaces of the second group of metal contacts 622-1, . . . , and 622-4 may be in direct contact with a top surface of the isolation layer 104.

The odd-numbered metal contacts 621-1 and 621-3 of the first group of metal contacts 621-1, . . . , and 621-4 may be spaced apart from the odd-numbered metal contacts 622-1 and 622-3 of the second group of metal contacts 622-1, . . . , and 622-4 in the second direction (i.e., a horizontal direction in FIG. 22), respectively. For example, the first metal contact 621-1 of the first group of metal contacts 621-1, . . . , and 621-4 may be spaced apart from the first metal contact 622-1 of the second group of metal contacts 622-1, . . . , and 622-4 in the second direction. Similarly, the third metal contact 621-3 of the first group of metal contacts 621-1, . . . , and 621-4 may be spaced apart from the third metal contact 622-3 of the second group of metal contacts 622-1, . . . , and 622-4 in the second direction. The even-numbered metal contacts 621-2 and 621-4 of the first group of metal contacts 621-1, . . . , and 621-4 may be spaced apart from the even-numbered metal contacts 622-2 and 622-4 of the second group of metal contacts 622-1, . . . , and 622-4 in the second direction, respectively. For example, the second metal contact 621-2 of the first group of metal contacts 621-1, . . . , and 621-4 may be spaced apart from the second metal contact 622-2 of the second group of metal contacts 622-1, . . . , and 622-4 in the second direction. Similarly, the fourth metal contact 621-4 of the first group of metal contacts 621-1, . . . , and 621-4 may be spaced apart from the fourth metal contact 622-4 of the second group of metal contacts 622-1, . . . , and 622-4 in the second direction. The number of the first group of metal contacts 621-1, . . . , and 621-4 may be equal to the number of the second group of metal contacts 622-1, . . . , and 622-4.

The dielectric layer 630 may be disposed on the first to third sidewall spacers 661, 662, and 663 to surround side surfaces of the first and second groups of metal contacts 621-1, . . . , 621-4, 622-1, . . . , and 622-4. The dielectric layer 630 may be disposed on both of the first and third sidewall spacers 661 and 663 to fill spaces between the first group of metal contacts 621-1, . . . , and 621-4 which are arrayed in the first direction. That is, the first and third sidewall spacers 661 and 663 may be disposed in a lower portion of each of spaces between the first group of metal contacts 621-1, . . . , and 621-4, and the dielectric layer 630 may be disposed in an upper portion of each of spaces between the first group of metal contacts 621-1, . . . , and 621-4. Similarly, the dielectric layer 630 may be disposed on both of the second and third sidewall spacers 662 and 663 to fill spaces between the second group of metal contacts 622-1, . . . , and 622-4 which are arrayed in the first direction. That is, the second and third sidewall spacers 662 and 663 may be disposed in a lower portion of each of spaces between the second group of metal contacts 622-1, . . . , and 622-4, and the dielectric layer 630 may be disposed in an upper portion of each of spaces between the second group of metal contacts 622-1, . . . , and 622-4. In an embodiment, the dielectric layer 630 may correspond to an interlayer dielectric (ILD) layer. The dielectric layer 630 may include, for example, a silicon dioxide ($SiO_2$) layer. The dielectric layer 630 and the first to third sidewall spacers 661, 662, and 663 may act as a capacitive dielectric material of the MIM capacitor 610.

The first metal electrode 642 may be disposed on the odd-numbered metal contacts 621-1 and 621-3 among the first group of metal contacts 621-1, . . . , and 621-4 and the odd-numbered metal contacts 622-1 and 622-3 among the second group of metal contacts 622-1, . . . , and 622-4. The first metal electrode 642 may have a planar shape. The first metal electrode 642 may be in direct contact with the top surfaces of the odd-numbered metal contacts 621-1 and 621-3 among the first group of metal contacts 621-1, . . . , and 621-4 and the top surfaces of the odd-numbered metal contacts 622-1 and 622-3 among the second group of metal contacts 622-1, . . . , and 622-4. When a voltage is applied to the first metal electrode 642, the first metal electrode 642 and the odd-numbered metal contacts 621-1, 621-3, 622-1, and 622-3 may act as a first electrode of the MIM capacitor 610.

The second metal electrode 644 may be disposed on the even-numbered metal contacts 621-2 and 621-4 among the first group of metal contacts 621-1, . . . , and 621-4 and the even-numbered metal contacts 622-2 and 622-4 among the second group of metal contacts 622-1, . . . , and 622-4. The second metal electrode 644 may have a planar shape. The second metal electrode 644 may be in direct contact with the top surfaces of the even-numbered metal contacts 621-2 and 621-4 among the first group of metal contacts 621-1, . . . , and 621-4 and the top surfaces of the even-numbered metal contacts 622-2 and 622-4 among the second group of metal contacts 622-1, . . . , and 622-4. When a voltage is applied to the second metal electrode 644, the second metal electrode 644 and the even-numbered metal contacts 621-2, 621-4, 622-2, and 622-4 may act as a second electrode of the MIM capacitor 610.

In an embodiment, the first group of metal contacts 621-1, . . . , and 621-4, the second group of metal contacts 622-1, . . . , and 622-4, the first metal electrode 642, and the second metal electrode 644 may be formed or comprised of the same metal material. In an embodiment, the first group of metal contacts 621-1, . . . , and 621-4, the second group of metal contacts 622-1, . . . , and 622-4, the first metal electrode 642, and the second metal electrode 644 may be formed of or include, for example, a copper (Cu) material, an aluminum (Al) material, a tantalum (Ta) material, a tantalum nitride (TaN) material, a titanium (Ti) material, a titanium nitride (TiN) material, or a combination thereof. In another embodiment, a metal material included in the first and second groups of metal contacts 621-1, . . . , 621-4, 622-1, . . . , and 622-4 may be different from a metal material included in the first metal electrode 642 and the second metal electrode 644.

According to the various embodiments described above, MIM capacitors may be provided by a fabrication process of general semiconductor devices without using any additional process, and a breakdown voltage and a capacitance value of the MIM capacitors may be easily adjusted by varying a distance between metal contacts.

A limited number of possible embodiments for the present teachings have been presented above for illustrative purposes. Those of ordinary skill in the art will appreciate that various modifications, additions, and substitutions are possible. While this patent document contains many specifics, these should not be construed as limitations on the scope of the present teachings or of what may be claimed, but rather as descriptions of features that may be specific to particular embodiments. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

While various embodiments have been described above, it will be understood to those skilled in the art that the embodiments are examples of the invention only and that the invention is not intended to be limited to these embodiments. Many other embodiments and variations of the invention may be envisioned by those skilled in the art to which the invention pertains without departing from the spirit and scope of the invention as defined by the appended claims.

What is claimed is:

1. A metal-insulator-metal (MIM) capacitor comprising:
a first group of metal contacts disposed on a first region of an isolation layer on a semiconductor layer spaced apart from each other in a first direction;
a second group of metal contacts disposed on a second region of the isolation layer spaced apart from each other in the first direction;
a dielectric layer disposed between the first group of metal contacts and the second group of metal contacts;
a first metal electrode disposed to contact top surfaces of the first group of metal contacts; and
a second metal electrode disposed to contact top surfaces of the second group of metal contacts,
wherein the first group of metal contacts are electrically coupled by the first metal electrode, and the second group of metal contacts are electrically coupled by the second metal electrode, and
wherein the second group of metal contacts face respective metal contacts of the first group of metal contacts in a second direction intersecting the first direction.

2. The MIM capacitor of claim 1, wherein the number of the first group of metal contacts is equal to the number of the second group of metal contacts.

3. The MIM capacitor of claim 1, wherein the isolation layer is a trench isolation layer.

4. The MIM capacitor of claim 1,
wherein the first metal electrode has a planar shape; and
wherein the second metal electrode has a planar shape.

* * * * *